United States Patent
Song et al.

(10) Patent No.: US 12,262,539 B2
(45) Date of Patent: *Mar. 25, 2025

(54) 3D NAND MEMORY DEVICE AND METHOD OF FORMING THE SAME

(71) Applicant: Yangtze Memory Technologies Co., Ltd., Hubei (CN)

(72) Inventors: Yali Song, Hubei (CN); Li Hong Xiao, Hubei (CN); Ming Wang, Hubei (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/507,574

(22) Filed: Nov. 13, 2023

(65) Prior Publication Data
US 2024/0090223 A1    Mar. 14, 2024

Related U.S. Application Data

(60) Continuation of application No. 18/468,801, filed on Sep. 18, 2023, now abandoned, which is a
(Continued)

(51) Int. Cl.
*H10B 43/27* (2023.01)
*G11C 16/04* (2006.01)
(Continued)

(52) U.S. Cl.
CPC ......... *H10B 43/27* (2023.02); *G11C 16/0483* (2013.01); *G11C 16/14* (2013.01);
(Continued)

(58) Field of Classification Search
CPC ........... H01L 27/11582; H01L 27/1157; H01L 27/11519; H01L 27/11556;
(Continued)

(56) References Cited

U.S. PATENT DOCUMENTS 6,989,317 B1   1/2006 Radens et al.
8,945,996 B2   2/2015 Tang et al.
(Continued)

FOREIGN PATENT DOCUMENTS

CN   101118907 A   2/2008
CN   101315936 A   12/2008
(Continued)

OTHER PUBLICATIONS

Office Action Issued on Nov. 28, 2020, in Application No. JP 2022-578922 with Machine Translation.
(Continued)

*Primary Examiner* — Khaja Ahmed
*Assistant Examiner* — Khatib A Rahman
(74) *Attorney, Agent, or Firm* — Oblon, McClelland, Maier & Neustadt, L.L.P.

(57) ABSTRACT

A 3D-NAND memory device is provided. The memory device includes a substrate, a bottom select gate (BSG) disposed over the substrate, a plurality of word lines positioned over the BSG with a staircase configuration and a plurality of insulating layers disposed between the substrate, the BSG, and the plurality of word lines. In the disclosed memory device, one or more first dielectric trenches are formed in the BSG and extend in a length direction of the substrate to separate the BSG into a plurality of sub-BSGs. In addition, one or more common source regions are formed over the substrate and extend in the length direction of the substrate. The one or more common source regions further extend through the BSG, the plurality of word lines and the plurality of insulating layers.

19 Claims, 27 Drawing Sheets

Related U.S. Application Data continuation of application No. 17/854,648, filed on Jun. 30, 2022, now Pat. No. 11,825,656, which is a continuation of application No. 17/154,105, filed on Jan. 21, 2021, now Pat. No. 11,404,441, which is a division of application No. 16/365,725, filed on Mar. 27, 2019, now Pat. No. 10,950,623, which is a continuation of application No. PCT/CN2018/119908, filed on Dec. 7, 2018.

(51) Int. Cl.
　　*G11C 16/14* 　　(2006.01)
　　*H01L 21/027* 　　(2006.01)
　　*H01L 21/311* 　　(2006.01)
　　*H01L 23/528* 　　(2006.01)
　　*H01L 29/08* 　　(2006.01)
　　*H01L 29/10* 　　(2006.01)
　　*H10B 43/10* 　　(2023.01)
　　*H10B 43/35* 　　(2023.01)

(52) U.S. Cl.
　　CPC ...... *H01L 21/31116* (2013.01); *H01L 23/528* (2013.01); *H01L 29/0847* (2013.01); *H01L 29/1037* (2013.01); *H10B 43/10* (2023.02); *H10B 43/35* (2023.02); *H01L 21/0276* (2013.01); *H01L 21/31144* (2013.01)

(58) Field of Classification Search
　　CPC ......... H01L 27/11551; H01L 27/11524; H01L 27/11529; H01L 29/42328; H01L 29/4344; H01L 21/31116; H01L 23/528; H01L 27/11565; H01L 29/0847; H01L 29/1037; H01L 21/0276; H01L 21/31144; H01L 27/11548; H01L 27/11575; H01L 27/1158; H01L 21/823475; G11C 16/14; G11C 16/0483; H10B 43/27; H10B 43/10; H10B 43/35; H10B 41/10; H10B 41/27; H10B 41/50; H10B 43/50; H10B 41/20; H10B 43/23
　　See application file for complete search history.

(56) References Cited

U.S. PATENT DOCUMENTS

| | | | |
|---|---|---|---|
| 9,299,450 B1 | 3/2016 | Pang et al. | |
| 9,299,718 B2 | 3/2016 | Park et al. | |
| 9,570,463 B1 | 2/2017 | Zhang et al. | |
| 9,589,978 B1 | 3/2017 | Yip | |
| 10,134,747 B2 | 11/2018 | Lee | |
| 10,141,372 B2 | 11/2018 | Park et al. | |
| 10,354,737 B2 | 7/2019 | Hu | |
| 10,355,010 B2 | 7/2019 | You et al. | |
| 10,559,583 B2 | 2/2020 | Park et al. | |
| 11,232,839 B1 | 1/2022 | Lee | |
| 11,430,811 B2 | 8/2022 | Song et al. | |
| 2006/0001174 A1 | 1/2006 | Matsui | |
| 2007/0287293 A1 | 12/2007 | Han et al. | |
| 2008/0173977 A1 | 7/2008 | Chinthakindi et al. | |
| 2010/0320528 A1 | 12/2010 | Jeong et al. | |
| 2012/0051138 A1 | 3/2012 | Kim et al. | |
| 2012/0112264 A1 | 5/2012 | Lee et al. | |
| 2012/0119283 A1* | 5/2012 | Lee | H10B 41/20 257/314 |
| 2012/0273956 A1 | 11/2012 | Watanabe | |
| 2012/0273964 A1 | 11/2012 | Kanki et al. | |
| 2012/0273965 A1 | 11/2012 | Seo et al. | |
| 2013/0161821 A1 | 6/2013 | Hwang et al. | |
| 2014/0035024 A1 | 2/2014 | Noh | |
| 2014/0138765 A1 | 5/2014 | Lee et al. | |
| 2014/0197470 A1 | 7/2014 | Lee | |
| 2015/0003169 A1 | 1/2015 | Nam et al. | |
| 2015/0137216 A1* | 5/2015 | Lee | H01L 29/7889 257/329 |
| 2015/0162084 A1 | 6/2015 | Morooka et al. | |
| 2015/0179660 A1* | 6/2015 | Yada | H01L 29/40117 257/314 |
| 2015/0255478 A1 | 9/2015 | Tanzawa | |
| 2015/0263029 A1 | 9/2015 | Kim et al. | |
| 2015/0340376 A1 | 11/2015 | Park et al. | |
| 2016/0005760 A1 | 1/2016 | Lee et al. | |
| 2016/0049423 A1 | 2/2016 | Yoo et al. | |
| 2016/0093631 A1 | 3/2016 | Yun et al. | |
| 2016/0111441 A1 | 4/2016 | Park et al. | |
| 2016/0233270 A1 | 8/2016 | Takaki et al. | |
| 2016/0293539 A1* | 10/2016 | Park | H10B 63/84 |
| 2017/0040061 A1 | 2/2017 | Yeh et al. | |
| 2017/0062337 A1 | 3/2017 | Park et al. | |
| 2017/0179026 A1 | 6/2017 | Toyama et al. | |
| 2017/0200676 A1 | 7/2017 | Jeong et al. | |
| 2018/0122819 A1 | 5/2018 | Shim et al. | |
| 2018/0130814 A1 | 5/2018 | Lee | |
| 2018/0182771 A1 | 6/2018 | Costa et al. | |
| 2018/0240527 A1 | 8/2018 | Zhang et al. | |
| 2018/0261618 A1 | 9/2018 | Lee et al. | |
| 2018/0286678 A1 | 10/2018 | Lee | |
| 2018/0337195 A1 | 11/2018 | Jayanti et al. | |
| 2018/0350830 A1 | 12/2018 | Lim | |
| 2019/0035798 A1 | 1/2019 | Hwang et al. | |
| 2019/0043885 A1* | 2/2019 | Lee | H01L 29/16 |
| 2019/0081069 A1 | 3/2019 | Lu | |
| 2019/0122734 A1 | 4/2019 | Shibata et al. | |
| 2019/0214404 A1 | 7/2019 | Ahn et al. | |
| 2019/0326317 A1 | 10/2019 | Jung | |
| 2020/0185411 A1 | 6/2020 | Herner | |
| 2020/0227555 A1 | 7/2020 | Sun | |
| 2020/0335514 A1* | 10/2020 | Xu | H10B 43/50 |
| 2020/0411535 A1 | 12/2020 | Wang | |

FOREIGN PATENT DOCUMENTS

| | | |
|---|---|---|
| CN | 103226973 A | 7/2013 |
| CN | 103680611 A | 3/2014 |
| CN | 103680618 A | 3/2014 |
| CN | 106601751 A | 4/2017 |
| CN | 106816442 A | 6/2017 |
| CN | 108431961 A | 8/2018 |
| CN | 108573979 A | 9/2018 |
| CN | 108807404 A | 11/2018 |
| CN | 108807411 A | 11/2018 |
| CN | 108831886 A | 11/2018 |
| CN | 108933139 A | 12/2018 |
| CN | 108933141 A | 12/2018 |
| CN | 108987272 A | 12/2018 |
| JP | 2001-250791 | 9/2001 |
| JP | 2009-295719 | 12/2009 |
| JP | 2010-509649 | 3/2010 |
| JP | 2010-514208 A | 4/2010 |
| JP | 2010-187000 A | 8/2010 |
| JP | 2011-028833 A | 2/2011 |
| JP | 2011-60838 A | 3/2011 |
| JP | 2011-60958 | 3/2011 |
| JP | 2011-243646 | 12/2011 |
| JP | 2012-9568 A | 1/2012 |
| JP | 2014-53538 A | 3/2014 |
| JP | 2014-241185 A | 12/2014 |
| JP | 2017-107938 A | 6/2017 |
| JP | 2017-135238 A | 8/2017 |
| JP | 2017-168701 A | 9/2017 |
| JP | 2018-163970 A | 10/2018 |
| JP | 2018-534765 A | 11/2018 |
| JP | 2020-16954 | 1/2020 |
| KR | 10-2016-0038145 A | 4/2016 |
| TW | 201834217 A | 9/2018 |
| TW | 201834218 A | 9/2018 |
| TW | 201842601 A | 12/2018 |
| WO | 2015/099668 A1 | 7/2015 |

(56) References Cited

FOREIGN PATENT DOCUMENTS

| WO | 2018/168391 A1 | 9/2018 |
|---|---|---|
| WO | WO 2018/161836 A1 | 9/2018 |

OTHER PUBLICATIONS

Preliminary Report issued on Nov. 16, 2020, in Application No. JP Application No. JP 2021-648148 with Machine Translation.
Combined Chinese Office Action and Search Report issued on Jul. 17, 2019, in Patent Application No. 201880002892.5, 7 pages (with English Translation of Category of Cited Documents).
International Search Report and Written Opinion of the International Search Authority issued on Sep. 18, 2019, in PCT/CN2018/119908, 9 pages.
Combined Chinese Office Action and Search Report issued on Oct. 10, 2020 in Patent Application No. 202010103862.2 (with English translation of Categories of Cited Documents), 7 pages.
Office Action dated May 23, 2022 issued in corresponding Indian Patent Application No. 202127020980.
Australian Examination Report issued May 5, 2022 in Australian Application No. 2018451633.
Singaporean Search Report completed Apr. 28, 2022 in Singaporean Application No. 11202104885P.
Singaporean Written Opinion issued Apr. 29, 2022 in Singaporean Application No. 11202104885P.
Extended European Search Report dated Apr. 28, 2022, issued in corresponding patent application No. 19914915.4.
Australian Examination Report dated Apr. 14, 2022 issued in corresponding application No. 2019455154.
Examination Report dated Apr. 4, 2022, issued in corresponding Indian patent application No. 202127051102.
Office Action dated Apr. 26, 2022, issued in corresponding Japanese patent application No. 2021-512764.
Extended European Search Report dated May 3, 2022 issued in corresponding patent application No. 18936326.0.
Office Action dated May 10, 2022 issued in corresponding Japanese patent application 2021-523013.
Supplementary European Search Report dated Apr. 21, 2022, issued in corresponding European U.S. Appl. No. 19/934,705.
Japanese Office Action dated Apr. 19, 2022 issued in corresponding patent application No. 2021-517442.
Japanese Office Action dated Apr. 19, 2022 issued in corresponding patent application No. 2021-519663.
Supplementary European Search Report dated Apr. 19, 2022 issued in corresponding U.S. Appl. No. 19/915,921.
Japanese Office Action issued on Jul. 19, 2022 in Japanese Patent Application No. 2021-532054, 4 pages.
European Official Notification issued on Dec. 14, 2022, in the European Application No. 18 942 303.1, 6 pages.
Office Action issued on May 23, 2023 in the Korean Patent Application No. 10-2021-7018257, 8 pages.
Summons to Attend Oral Proceedings issued on Jun. 14, 2023, in the European Patent Application No. 18 942 303.1, (10 pages).
Notice of Reasons for Refusal issued Sep. 2, 2024, in Japanese Patent Application No. 2023-096371 filed on Dec. 7, 2018, with English Translation (5 pages).
Seiichi Aritome, portions of Nand Flash Memory technologies, First Edition, pp. 17-18, 275-278, 336, 338 and 368, published by John Wiley & Sons, Inc., 2016 (total of 9 pgs.).
Andrea Silvagni, portions of 3D NAND Flash Based on Planar Cells, Computers, 6, 28, pp. 1-2 and 6, published Oct. 24, 2017 (total of 3 pgs.).
R. Micheloni, et al., portions of Inside Solid State Drives (SSDs), pp. 94, 107 and 124, published by Springer, 2018 (total of 3 pgs.).
File History of U.S. Pat. No. 11,430,811 (U.S. Appl. No. 17/154,054); 284 pages.

* cited by examiner

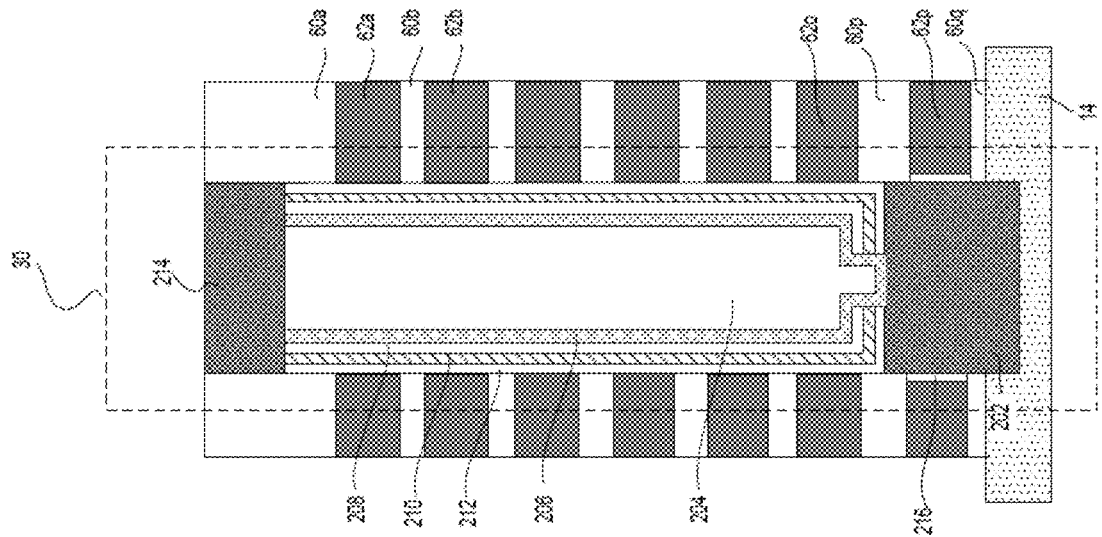
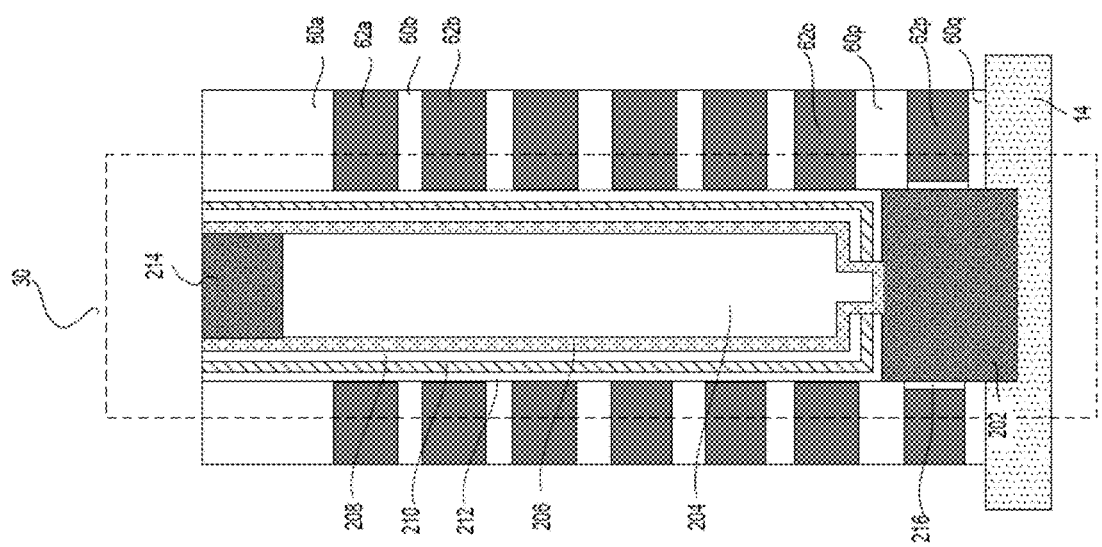
FIG. 1C-1
FIG. 1C-2

3D NAND MEMORY DEVICE AND METHOD OF FORMING THE SAME

RELATED APPLICATION

This application is a continuation of U.S. patent application Ser. No. 18/468,801 filed on Sep. 18, 2023, which is a continuation of U.S. patent application Ser. No. 17/854,648 filed on Jun. 30, 2022, which is a continuation of U.S. patent application Ser. No. 17/154,105 filed on Jan. 21, 2021, now U.S. Pat. No. 11,404,441, issued Aug. 2, 2022, which is a divisional of U.S. patent application Ser. No. 16/365,725 filed on Mar. 27, 2019, now U.S. Pat. No. 10,950,623, issued Mar. 16, 2021, which is a continuation of International Application No. PCT/CN2018/119908, filed on Dec. 7, 2018. The entire contents of the above-identified applications are incorporated herein by reference in their entirety.

BACKGROUND

As critical dimensions of devices in integrated circuits shrink to the limits of common memory cell technologies, designers have been looking to techniques for stacking multiple planes of memory cells to achieve greater storage capacity, and to achieve lower costs per bit.

A 3D-NAND memory device is an exemplary device of stacking multiple planes of memory cells to achieve greater storage capacity, and to achieve lower costs per bit. As 3D NAND technology migrates towards high density and high capacity, especially from 64 L to 128 L architecture, the number of word line layers (or gate control layers) in a vertical direction perpendicular to a substrate has been increasing significantly. The increasing number of word line layers leads to a dramatic increase of block size of the 3D-NAND memory device, which in turn induces longer read and erase time, longer data transfer time, and lower storage efficiency.

SUMMARY

The inventive concepts relate to formation of a 3D NAND memory device with a divided block structure and a method of performing a partial block erase based on the divided block structure.

A related 3D-NAND memory device can include a plurality of memory cell blocks or memory cell arrays. Each of the blocks can include a plurality of vertical NAND memory cell strings. The vertical NAND memory cell strings can each have one or more bottom select transistors (BSTs), one or more dummy BSTs, a plurality of memory cells (MCs), one or more dummy top select transistors (TSTs), and one or more TSTs that are disposed sequentially and in series over a substrate along a height direction (or Z direction) of the substrate. A source region of a lowermost BST in the each of the vertical NAND memory cell strings is connected to a common source line (CSL), and a drain region of an uppermost TST in the each of the vertical NAND memory cell strings is connected to a bit line. In the related 3D-NAND memory device, the vertical NAND memory cell strings of a same block can share a bottom select gate (BSG). The shared BSG accordingly controls all the BSTs of the vertical NAND memory cell strings in that block simultaneously during operating the related 3D-NAND memory device, such as erasing the related 3D-NAND memory device. As the related 3D-NAND memory device migrates to higher capacity with an increased block size, the shared BSG can induce longer erasing time, longer data transfer time, and lower storage efficiency.

In the disclosed 3D-NAND memory device, each of the blocks can be separated into a plurality of sub-blocks by dividing the shared BSG into a plurality of sub-BSGs through one or more first dielectric trenches. Each of the sub-blocks accordingly has a respective sub-BSG, and each of the sub-blocks can be operated individually through controlling the respective sub-BSG. By introducing such a divided BSG structure, the disclosed 3D-NAND memory device can effectively reduce parasitic capacitance and coupling effects between the BSG and adjacent dielectric layers, and significantly improve $V_t$ performance of the bottom select transistors (BSTs). In addition, the erasing time and data transfer time could be reduced significantly, and data storage efficiency can be improved as well.

In the disclosed 3D-NAND memory device, the each of sub-blocks can also have a respective sub-top select gate (sub-TSG) by dividing a shared/common TSG into a plurality of sub-TSGs through one or more second dielectric trenches. Each of the sub-TSGs can control a respective sub-block during a reading/programming operation. In some embodiments, the first and second dielectric trenches can be formed via a same reticle set so that a manufacturing cost can be reduced.

According to an aspect of the present disclosure, a memory device is provided. The memory device can include a substrate, a bottom select gate (BSG) disposed over the substrate, a plurality of word lines positioned over the BSG with a staircase configuration and a top select gate (TSG) positioned over the plurality of word lines. The memory device also includes a plurality of insulating layers disposed between the substrate, the BSG, the plurality of word lines, and the TSG. In the disclosed memory device, one or more first dielectric trenches are formed in the BSG and extend in a length direction of the substrate to separate the BSG into a plurality of sub-BSGs.

In addition, one or more second dielectric trenches are formed in the TSG and extend in the length direction (X-direction) of the substrate to separate the TSG into a plurality of sub-TSGs. The memory device further includes one or more common source regions that are formed over the substrate and extend in the length direction of the substrate. Each of the one or more common source regions extends through the BSG, the plurality of word lines, the TSG, and the plurality of insulating layers, and is electrically coupled with the substrate via a respective doped region. The one or more common source regions, the first dielectric trenches and the second dielectric trenches further extend parallel to each other along the length direction of the substrate.

In some embodiments, the first dielectric trenches and the second dielectric trenches are aligned with each other in a width direction (Y-direction) of the substrate and are spaced apart by the plurality of word lines.

The memory device also includes a plurality of channel structures formed over the substrate along a height direction (Z-direction) of the substrate that is perpendicular to the substrate. Each of the plurality of channel structure passes through the BSG, the plurality of word lines, the TSG and the plurality of insulating layers, and is electrically coupled with the substrate via a respective bottom channel contact that extends into the substrate. The each of the plurality of channel structures further includes a channel layer, a tunneling layer, a charge trapping layer, and a barrier layer.

The memory device also includes a plurality of dummy channel structures formed along the height direction of the substrate. The plurality of dummy channel structures pass through the BSG, the plurality of word lines and the plurality of insulating layers to extend into the substrate.

The memory device also includes a plurality of memory cell strings. Each of the memory strings incudes a respective channel structure, a respective sub-BSG, the plurality of word lines, a respective sub-TSG, and the plurality of insulating layers that separate the respective sub-BSG, the plurality of word lines, and the respective sub-TSG from one another.

The memory device also includes a plurality of memory cell sub-blocks. Each of the memory cell sub-blocks including a respective plurality of memory cell strings that are connected to a same sub-BSG and to a same sub-TSG, and each of the memory cell sub-blocks is operated individually.

The memory device can further include a plurality of dummy channel structures formed along the height direction of the substrate. The plurality of dummy channel structures pass through the BSG, the plurality of word lines, the TSG and the plurality of insulating layers to extend into the substrate.

In some embodiments, the one or more first dielectric trenches and the one or more common source regions are alternatively disposed in the width direction of the substrate so that a plurality of channel structures are disposed therebetween.

In some embodiments, the memory device further includes one or more dummy BSGs that are formed between the plurality of word lines and the BSG, separated by the one or more first dielectric trenches into a plurality of dummy sub-BSGs, and spaced apart from the plurality of word lines and the BSG by the plurality of insulating layers.

In some embodiments, the memory device further includes one or more dummy TSGs that are formed between the plurality of word lines and the TSG, separated by the one or more second dielectric trenches into a plurality of dummy sub-TSGs, and spaced apart from the plurality of the word lines and the TSG by the plurality of insulating layers.

According to an aspect of the present disclosure, a method for manufacturing a memory device is provided. In the disclosed method, a bottom select gate (BSG) layer is formed over a substrate, one or more dummy BSG layers are formed over the BSG layer, and a plurality of first insulating layers are disposed between the substrate, the BSG layer, and the one or more dummy BSG layers. Next, one or more first dielectric trenches are formed. The one or more first dielectric trenches pass through the BSG layer, the one or more dummy BSG layers and the plurality of first insulating layers, and extend into the substrate along a length direction of the substrate. The BSG layer is separated by the one or more first dielectric trenches into a plurality of sub-BSG layers, and the one or more dummy BSG layers are separated by the one or more first dielectric trenches into a plurality of dummy sub-BSG layers.

In the disclosed method, a plurality of word line layers are subsequently formed over the dummy BSG layers, one or more dummy top select gates (TSG) layers are formed over the plurality of word line layers, a TSG layer is formed over the dummy BSG layers, and a plurality of second insulating layers are disposed between the dummy BSG layers, the plurality of word line layers, the one or more dummy TSG layers, and the TSG layer. Next, one or more second dielectric trenches are formed. The second dielectric trenches extend in the length direction of the substrate, and passes through the one or more dummy TSG layers, the TSG layer and a portion of the plurality of second insulating layers that separate an uppermost word line layer, the one or more dummy TSG layers, and the TSG layer from each other. The first dielectric trenches and the second dielectric trenches are aligned with each other in a width direction of the substrate and are spaced apart by the plurality of word line layers. The TSG layer is separated by the one or more second dielectric trenches into a plurality of sub-TSG layers, and the one or more dummy TSG layers are separated by the one or more second dielectric trenches into a plurality of dummy sub-TSG layers.

According to yet another aspect of the present disclosure, a method for erasing a 3D-NAND memory device is provided. The 3D-NAND memory device are formed over a substrate and includes a plurality of vertical NAND strings in which a first block of the plurality of vertical NAND strings are connected to a first bottom select gate (BSG), a second block of the plurality of vertical NAND strings are connected to a second BSG, the first BSG and the second BSG are separated by a dielectric trench, and both the first block and the second block of vertical NAND strings are connected to a plurality of shared word lines. In the disclosed method, the substrate is set to a first voltage, the first BSG is set to a second voltage that is lower than the first voltage, the second BSG is set to a third voltage that is higher than the second voltage, and the one or more word lines are set to a fourth voltage that is equal to zero.

In some embodiments, the first block of the plurality of vertical NAND strings are erased through applying the second voltage to the first BSG, and the second block of the plurality of vertical NAND strings are not erased through applying the third voltage to the second BSG.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1C-1 is a first cross-sectional view of a channel structure in the 3D-NAND memory device, in accordance with exemplary embodiments of the disclosure.

FIG. 1D-1 is a first top down view of the channel structure in the 3D-NAND memory device, in accordance with exemplary embodiments of the disclosure.

FIG. 1C-2 is a second cross-sectional view of a channel structure in the 3D-NAND memory device, in accordance with exemplary embodiments of the disclosure.

FIG. 1D-2 is a second top down view of the channel structure in the 3D-NAND memory device, in accordance with exemplary embodiments of the disclosure.

FIG. 2 is a schematic perspective view of a 3D-NAND memory device in three-dimensions, in accordance with exemplary embodiments of the disclosure.

DETAILED DESCRIPTION

Figure 1A:
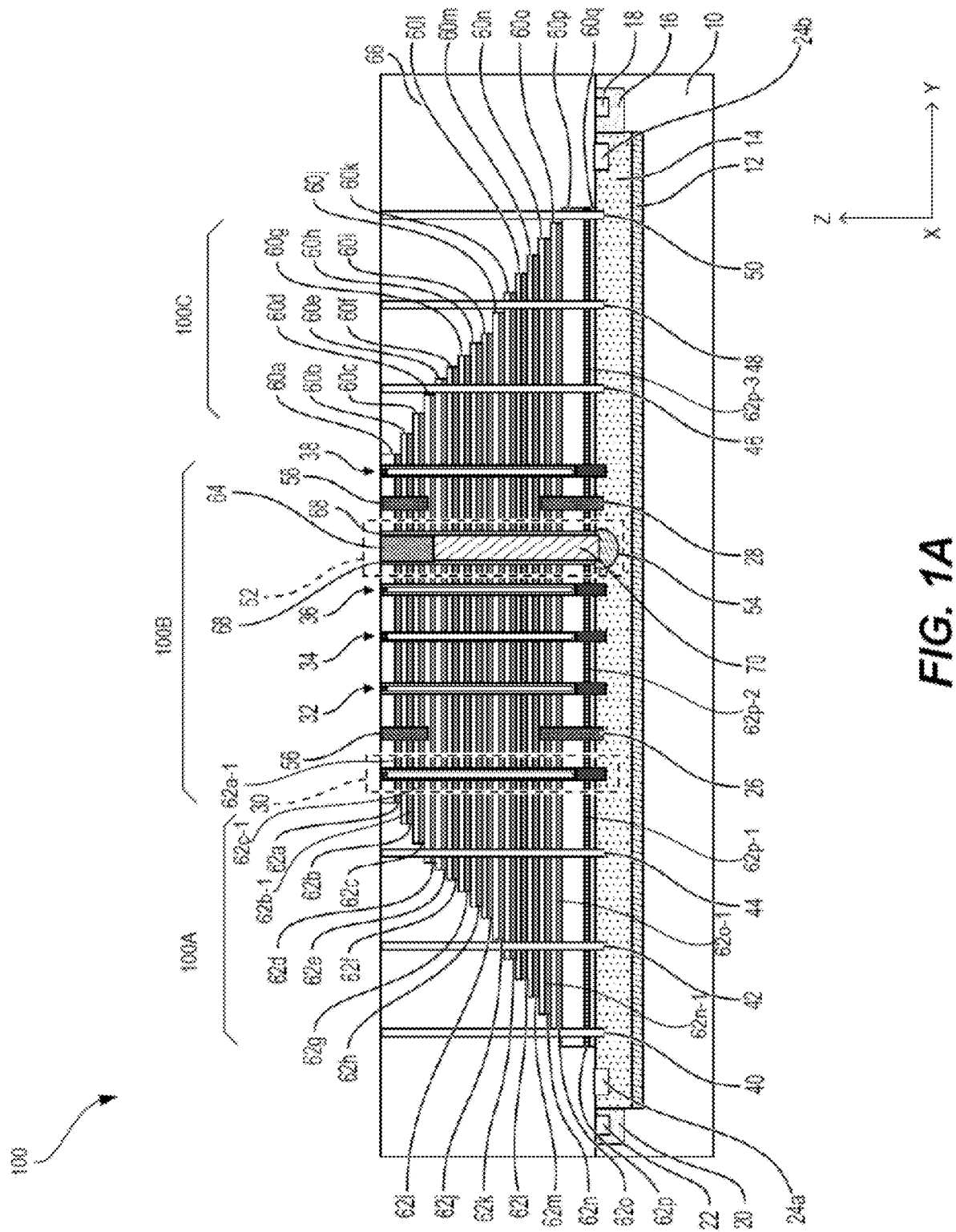
FIG. 1A is a cross-sectional view of a 3D-NAND memory device, in accordance with exemplary embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed features may be in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
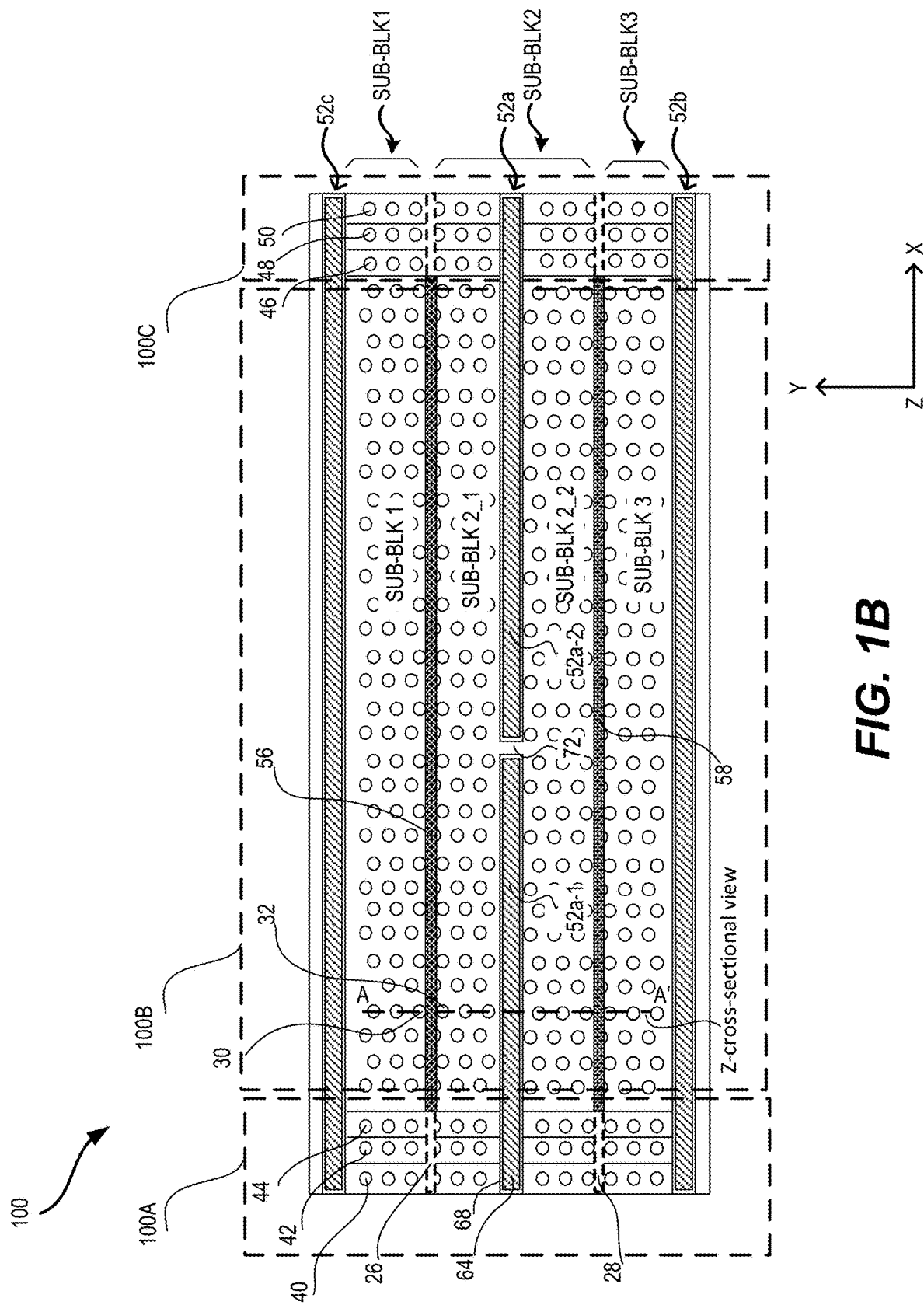
FIG. 1B is a top down view of the 3D-NAND memory device, in accordance with exemplary embodiments of the disclosure.

FIG. 1A is a cross-sectional view of a 3D-NAND memory device 100, and FIG. 1B is a top down view of the 3D-NAND memory device 100 where the cross-sectional view of the 3D-NAND memory device 100 in FIG. 1A is obtained from a line A-A' along a Z-direction (i.e., height direction) of a substrate in FIG. 1B. Dashed lines in FIG. 1B indicate a perspective view.

As shown in FIG. 1A, the memory device 100 can have a substrate 10 made of silicon, a high voltage P-type Well (HVPW) 14 formed on a top portion of the substrate 10, and a deep N-type Well 12 that is disposed below the HVPW. The HVPW 14 extends from a top surface of the substrate 10 and into the substrate with a depth from 0.5 um to 5 um according to the design requirements. The HVPW 14 can have a top portion and a bottom portion. The top portion (not shown) of the HVPW 14 is level with the top surface of the substrate 10 and is doped with boron at a dopant concentration from $10e11$ $cm^{-3}$ to $10e14$ $cm^{-3}$. The top portion of the HVPW 14 forms the array (i.e., memory cell region) P-Well. The array P-Well is also known as 'active tub' since voltages are applied to the tub during erasing or programming the memory device. The top portion can also be configured to create bipolar junction transistor (BJT) devices in periphery where control circuits occupy. The bottom portion (not shown) of the HVPW 14 is formed under the top portion and is doped with phosphorus at a dopant concentration from $10e11$ $cm^{-3}$ to $10e14$ $cm^{-3}$. The bottom portion creates a deep 'N-Tub' that helps isolate the array P-Well (i.e., the top portion) from the periphery P-Wells. The bottom portion can also be configured to create BJT devices in periphery.

The deep N-type Well 12 illustrated in FIG. 1A can be doped through a high energy implantation with phosphorus at a dopant concentration from $10e11$ $cm^{-3}$ to $10e14$ $cm^{-3}$. The deep N-type Well 12 is formed under the HVPW 14, and extends into the substrate with a depth from 0.1 um 1 um according to design requirements. In some embodiments, the deep N-type Well 12 can surround the HVPW 14 to isolate the HVPW 14 from adjacent components.

Still referring to FIG. 1A, the memory device 100 can also have one or more P+ regions 24a and 24b formed in the HVPW 14. The P+ regions extend from the top surface of the substrate 10 and into the substrate with a depth from 0.01 um to 0.2 um. The P+ regions can be doped with boron at a dopant concentration from $10e14$ $cm^{-3}$ to $10e18$ $cm^{-3}$. In subsequent manufacturing steps, a respective array contact can be formed over each of the P+ regions, and the P+ regions are configured to reduce resistance between the array contacts and the HVPW.

Similarly, one or more N+ regions 18 and 22 can be formed in the substrate 10. The N+ regions 18 and 22 extend from the top surface of the substrate and extend into the substrate with a depth from 0.01 um to 0.2 um. The N+ regions can be doped with phosphorus at a dopant concentration from $10e14$ $cm^{-3}$ to $10e18$ $cm^{-3}$. Over the N+ regions, one or more substrate contacts (not shown) can be formed in subsequent manufacturing steps, and the N+ regions are configured to reduce resistance between the substrate contacts and the substrate.

The disclosed memory device 100 can also include one or more high voltage N-type Wells (HVNW). Each of the N+ regions can be surrounded by a respective high voltage N-type Well (HVNW). For example, the N+ region 22 is surrounded by a HVNW 20, and the N+ region 18 is surrounded b a HVNW 16. The HVNWs can be formed by doping the substrate with phosphorus at a dopant concentration from $10e11$ $cm^{-3}$ to $10e14$ $cm^{-3}$. The HVNWs extend from the top surface of the substrate and extend into the substrate 10 with a depth from 0.1 um to 1 um. The HVNWs are configured to isolate the N+ regions from adjacent components.

Still referring to FIG. 1A, a bottom select gate (BSG) 62p, one or more dummy BSGs (or bottom dummy word lines, such as 62n-62o), a plurality of word lines (e.g., 62d-62m), one or more dummy top select gates (TSGs) (or top dummy word lines, such as 62b-62c), and a TSG 62a are disposed sequentially over the substrate. In addition, a plurality of insulating layers, such as 17 insulating layers 60a-60q, are disposed between the substrate 10, the BSG, the dummy BSGs, the word lines, the dummy TSGs and the TSG to separate the substrate 10, the BSG, the dummy BSGs, the word lines, the dummy TSGs and the TSG from each other.

In some embodiments, the insulating layers 60, the BSG, the dummy BSGs, the word lines, the dummy TSGs and the TSG are alternatively stacked over the substrate 10 with a staircase configuration in which the TSG 62a and a uppermost insulating layer 60a have the smallest length, and the BSG 62p and a lowermost insulating layer 60q have the largest length.

It should be understood that FIG. 1A is merely an exemplary 3D-NAND memory device 100, and the 3D-NAND memory device 100 can include any number of the BSG, the dummy BSG, the word line, the dummy TSG, and the TSG. For example, the 3D-NAND memory device 100 can have three BSGs, three TSGs, and 64 word lines.

In some embodiments (i.e. Gate-last Formation Technology), the BSG 62p, the dummy BSGs 62n-62o, the word lines 62d-62m, the dummy TSGs 62b-62c, and the TSG 62a illustrated in FIG. 1A are formed firstly using sacrificial layers (i.e. SiN). The sacrificial layers can be removed and replaced with a high K layer, glue layers and one or more metal layers. The high K layer can be made of aluminum oxide ($Al_2O_3$) and/or Hafnium oxide ($HfO_2$) and/or Tantalum oxide ($Ta_2O_5$), and/or something of high K (Dielectric Constant). The metal layer can be made of tungsten (W), Cobalt (Co), for example. The word lines can have a thickness in a range from 10 nm to 100 nm, according to requirements of product specification, device operation, manufacturing capabilities, and so on. In an embodiment of FIG. 1, the insulating layers 60 can be made of $SiO_2$ with a thickness from 5 nm to 50 nm.

Still referring to FIG. 1A, one or more first dielectric trenches (or first trenches), such as two first trenches 26 and 28, are formed in the one or more BSGs (e.g., 62p) and the one or more dummy BSGs (e.g., 62n-62o). The first trenches 26 and 28 extends in an X-direction (i.e., length direction) of the substrate 10 to separate the BSG 62p and the dummy BSGs 62n-62o layers into a plurality of sub-BSGs and sub-dummy BSGs, or to say, a plurality of cell strings. For example, three sub-BSGs 62p-1, 62p-2, and 62p-3 are included in embodiment shown in FIG. 1A. In addition, one or more second dielectric trenches (or second trenches), such as the two second trenches 56 and 58 illustrated in FIG. 1A, are formed in the one or more TSGs (e.g., 62a) and the one or more dummy TSGs (e.g., 62b-62c). The second trenches also extend in the X-direction (length direction) of the substrate 10 to separate the TSG 62a and dummy TSGs 62b-62c into a plurality of sub-TSGs and sub-dummy TSGs. For example, a sub-TSG 62a-1, two sub-dummy TSGs 62b-1 and 62c-1 are illustrated in FIG. 1A. In some embodiments, the first trenches and the second trenches are optically aligned with each other in a Y-direction (i.e., a width direction, top-down view) of the substrate 10 and are spaced apart by the plurality of word lines 62d-62m. In some embodiments, the first and second trenches can have a CD 50 nm to 150 nm and are filled with $SiO_2$, SiON, SiOCN, or other suitable dielectric materials. In some embodiments, the first trenches 26 and 28 can extend into the HVPW 14 with a depth between 10 nm and 100 nm.

By introducing the first and second trenches into the memory device 100, the BSG and TSG are separated into a plurality of sub-BSGs and sub-TSGs. The sub-BSGs and sub-TSGs can divide the memory device 100 into a plurality of sub-blocks, or to say, a plurality of cell strings. Each of the sub-blocks has a respective sub-BSG and a respective sub-TSG. The each of the sub-blocks can be operated individually through controlling the respective sub-BSG and respective sub-TSG. Correspondingly, the disclosed 3D-NAND memory device 100 can precisely control a desired sub-block/array region so as to effectively reduce a programming time, a reading time, an erasing time and data transfer time, and significantly improve data storage efficiency.

Still referring to FIG. 1A, one or more common source regions (CSRs), such as one common source region 52, is formed over the substrate and extend in the X-direction (length direction) of the substrate. The common source region 52 passes through the BSG 62p, the dummy BSGs 62n-62o, the plurality of word lines 62d-62m, the dummy TSGs 62b-62c, the TSG 62a, and the plurality of insulating layers 60, and is electrically coupled with the substrate 10 via a doped region 54. The common source region 52, the first trenches 26 and 28, and the second trenches 56 and 58 extend parallel to each other in the X-direction (length direction) of the substrate 10. The common source region 52 can have side portions and a bottom portion to be electrically coupled with the dope region 54. A dielectric spacer 68 is formed along the side portions and in direct contact with the word lines 62d-62m and insulating layers 60. A conductive layer 70 is formed along the dielectric spacer 68 and over the doped region 54. The common source region 52 further includes a top contact 64 that is formed along the dielectric spacer 68 and over the conductive layer 70. The doped region 54 can be N-type doped through one or more ion implantation processes. In an embodiment of FIG. 1A, the dielectric spacer 68 is made of $SiO_2$, the conductive layer 70 is made of polysilicon, and the top contact 64 is made of tungsten.

In some embodiments, the common source region 52 can have a continuous configuration to extend along the X-direction (length direction) of the substrate. In some embodiments, the common source region 52 can be separated into two or more sub-CSRs. The sub-CSRs are aligned with each other in the X-direction of the substrate.

In the 3D-NAND memory device 100, a plurality of channel structures are formed over the substrate 10 along a Z-direction (or height direction) of the substrate. As shown in FIG. 1A, five contact structures 30, 32, 34, 36 and 38 are included. Each of the channel structures passes through the BSG, the dummy BSGs, the word lines, the dummy TSGs, the TSG and the insulating layers, and is electrically coupled with the substrate via a respective bottom channel contact that extends into the substrate. For example, a contact structure 30 is electrically coupled with the substrate via a bottom contact 202 that is shown in FIG. 1C. In addition, each of the channel structures further includes a channel layer 206, a tunneling layer 208, a charge trapping layer 210, and a barrier layer 212, which has been shown in FIGS. 1C and 1D for details.

The memory device 100 can further include a plurality of dummy channel structures that are formed along the Z-direction (height direction) of the substrate. For example, six dummy channel structures 40, 42, 44, 46, 48, and 50 are included in the memory device 100. In some embodiments, the memory device 100 can be divided into three regions: Two staircase regions 100A and 100C and a core region 100B. As shown, the staircase regions 100A and 100C can be arranged on single or both sides of the central core region 100B of the memory device 100. The staircase regions 100A and 100C do not include any channel structures, and the core region 100B includes the plurality of channel structures. In some embodiments, the dummy channel structures are formed in the staircase regions 100A and 100C only, and pass through the BSG, the dummy BSGs, the word lines and the insulating layers to extend into the substrate. In other embodiments, the dummy channel structures can be formed in both the staircase regions 100A and 100C and the core region 100B. When the dummy channel structures are formed in the core region 100B, the dummy channel structures pass through the TSG, the dummy TSGs, the word lines, the dummy BSGs, and the BSG, and extend into the substrate. The dummy channel structures serve as sustain components to support the staircase regions and/or the core regions when sacrificial word lines are removed. In an embodiment of FIG. 1A, the dummy channel structures are made of $SiO_2$.

FIG. 1B is a top down view of the 3D NAND memory device 100 in accordance with some embodiments of the disclosure. As shown in FIG. 1B, the memory device 100 can have three common source regions 52a-52c that extend along the X-direction (length direction) of the substrate 10. The common source regions 52b and 52C are disposed at two boundaries of the memory device 100 with a continuous configuration. The common source regions 52b and 52C can serve as common source regions for the memory device 100, and further isolate the memory device 100 from adjacent components. In some embodiments, the memory device 100 is one of memory cell blocks of a 3D-NAND chip (not shown). The common source regions 52b and 52C accordingly isolate the memory device 100 (or the memory cell block 100) from adjacent memory cell blocks of the 3D-NAND chip. The common source region 52a is disposed at a middle position of the memory device 100. The common source region 52a is separated into two or more sub-CSRs by one or more "H-Cuts". As shown in FIG. 1B, the CRS 52a is separated by an H-cut 72 into two sub-CSRs 52a-1 and 52a-2.

Still referring to FIG. 1B, the first trenches 26 and 28, and the second trenches 56 and 58 are optionally aligned with each other at the Y direction (width direction) of the substrate 10. The first trenches and the second trenches are disposed between two adjacent common source regions. For example, the first trench 26 and the second trench 56 are aligned and disposed between a common source region 52a and a common source region 52b. In addition, the dummy channel structures 40, 42, and 44 are positioned at the staircase region 100A, and the dummy structures 46, 48, and 50 are positioned at the staircase region 100C. A plurality of channel structures, such as channel structures 30, 32, are disposed in the core region 100B.

By introducing the first/second trenches, the 3D-NAND memory device 100 (or memory cell block 100) can be divided into a plurality of sub-blocks. For example, three sub-blocks SUB-BLK 1-3 are formed in FIG. 1B. Each sub-block can have a respective sub-BSG and a respective sub-TSG. The sub-BSG is formed by separating the BSG 62p into three sub-BSGs (i.e., 62p-1, 62p-2, and 62p-3) by the first trenches, and the sub-TSG is formed by separating the TSG 62a into three sub-TSGs by the second trenches. It should be mentioned that the SUB-BLK 2 can have two portions SUB-BLK2_1 and SUB_BLK_2 that are electrically connected with each other through the H-Cut 72. Accordingly, The SUB-BLK 2 can have a larger size than the SUB-BLK 1and SUB-BLK 3. Without the introduction of the first/second trenches, the memory device 100 (or the memory cell block 100) has a shared BSG, such as 62p, and a shared TSG, such as 62a.

It should be understood that FIG. 1B is merely an exemplary 3D NAND memory device 100, and the 3D NAND memory device 100 can include any number of first trenches or second trenches between two adjacent common source regions. For example, two or more first trenches or two or more second trenches can be disposed between two adjacent common source regions. The 3D NAND memory device 100 can also include any number of common source regions.

Figures 1, 1D:
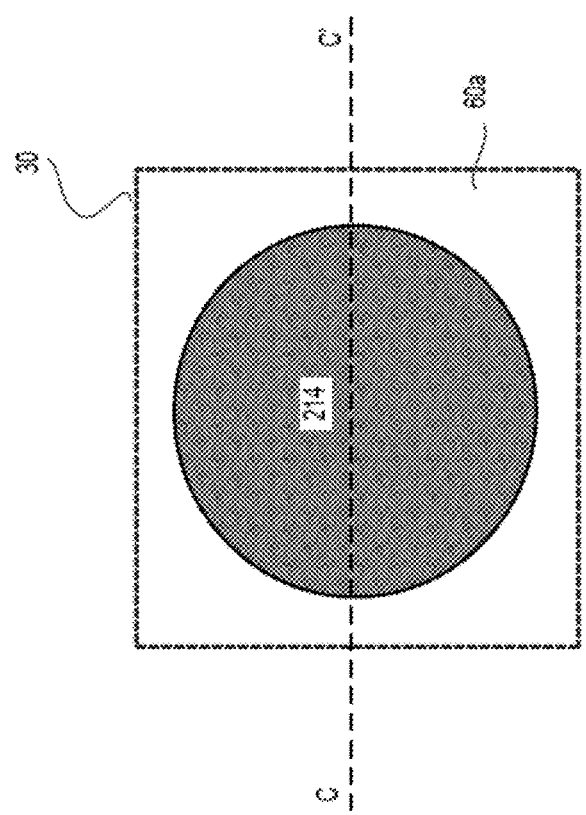
Figures 1, 1D, 2:
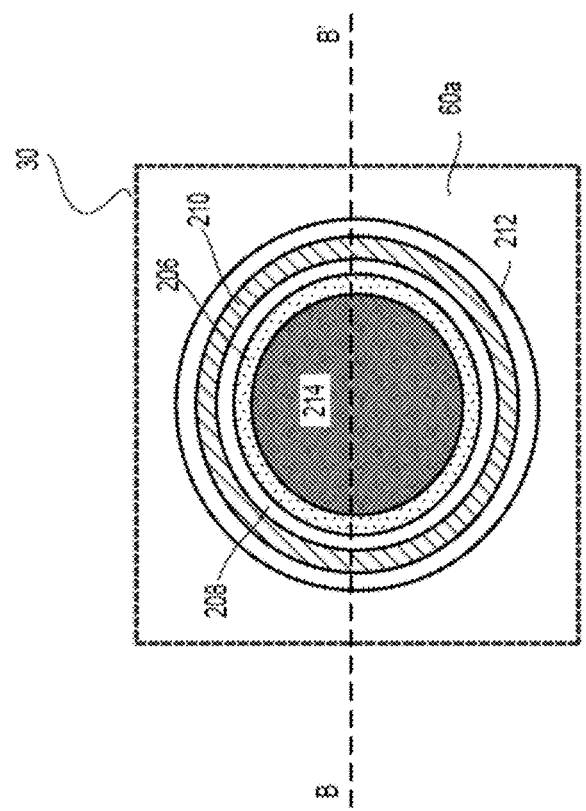

FIG. 1C-1 is a first cross-sectional view of the channel structure 30 in the 3D-NAND memory device 100, and FIG. 1D-1 is a first top down view of the channel structure 30 where the cross-sectional view of FIG. 1C-1 is obtained from a line B-B' along a Z-direction (height direction) of a substrate in FIG. 1D-1. FIG. 1C-2 is a second cross-sectional view of the channel structure 30 and FIG. 1D-2 is a second top down view where the cross-sectional view of FIG. 1C-2 is obtained from a line C-C' along a Z-direction (height direction) of a substrate in FIG. 1D-2.

As shown in FIGS. 1C-1/1D-1, the channel structure 30 can have a cylindrical shape with sidewalls and a bottom region. Of course, other shapes are possible. The channel structure 30 is formed along a Z-direction perpendicular to the substrate 10, and electrically coupled with the substrate 10 via a bottom channel contact 202 that is positioned at the bottom region of the channel structure. The channel structure 30 further includes a channel layer 206, a tunneling layer 208, a charge trapping layer 210, and a barrier layer 212. The barrier layer 212 is formed along the sidewalls of the channel structure 30 and over bottom channel contact 202. The barrier layer 212 is in direct contact with the word lines 62d-62m and the insulating layers 60. The charge trapping layer 210 is formed along the barrier layer 212 and over the bottom channel contact 202, and the tunneling layer 208 is formed along the charge trapping layer 210 and over the bottom channel contact 202. The channel layer 206 has side portions that is formed along the tunneling layer 208 and has a T-shape bottom portion that extends through bottom portions of the tunneling layer 208, the charge trapping layer 210, and the barrier layer 212 that are positioned over the bottom channel contact 202. The T-shape bottom portion of the channel layer 206 further is positioned over the bottom contact 206 and is in direct contact with the bottom channel contact 202. In addition, the tunneling layer 208, the charge trapping layer 210, and the barrier layer 212 can form an "L-foot" configuration in the channel structure 30. The L-foot configuration can include side portions that are formed along the sidewalls of the channel structure and a bottom portion over the bottom channel contact 202.

The channel structure 30 can also have a channel insulating layer 204 that is formed along the channel layer 206 to fill the channel structure 30. The channel insulating layer 204 can have a T-shape bottom portion that extends through bottom portions of the channel layer 206, the tunneling layer 208, the charge trapping layer 210, and the barrier layer 212 and lands on the channel layer 206. In some embodiments, the channel insulating layer 204 can include a void that is positioned in a middle position of the channel insulating layer 204. The channel structure 30 can further include a top channel contact 214 that is formed along the channel insulating layer 204 and in direct contact with the channel layer 206. The top channel contact 214 is positioned above the TSG 62a to prevent any electrical interference between the top channel contact 214 and the TSG 62a. In the channel structure 30, a gate dielectric layer 216 is further formed between the BSG 62p and the bottom channel contact 202. The gate dielectric layer 216 can be positioned between the insulating layer 60p and 60q, and have an annular shape to surround the bottom channel contact 202.

In an embodiment of FIGS. 1C-1/1D-1, the barrier layer 212 is made of $SiO_2$. In another embodiment, the barrier layer 212 can include multiple layers, such as $SiO_2$ and $Al_2O_3$. In an embodiment of FIGS. 1C-1/1D-1, the charge trapping layer 210 is made of SiN. In another embodiment, the charge trapping layer 210 can include a multi-layer configuration, such as a SiN/SiON/SiN multi-layer configuration. In some embodiments, the tunneling layer 208 can include a multi-layer configuration, such as a SiO/SiON/SiO multi-layer configuration. In an embodiment of FIGS. 1C-1/ 1D-1, the channel layer 206 is made of polysilicon via a furnace low pressure chemical vapor deposition (CVD) process. The channel insulating layer 204 can be made of $SiO_2$, and the top and bottom channel contacts can be made of polysilicon.

As shown in FIGS. 1C-1/1D-1, the channel structure 30 can have a cylindrical shape. However, the present disclosure is not limited thereto, and the channel structures 30 may be formed in other shapes, such as a square pillar-shape, an oval pillar-shape, or any other suitable shapes.

FIGS. 1C-2/1D-2 provides another configuration to dispose the top channel contact 214 in the channel structure 30. As shown in FIGS. 1C-2/1D-2, the top channel contact 214 is formed along the insulating layer 60a and over the channel layer 206, tunneling layer 208, charge trapping layer 210, barrier layer 212, and channel insulating layer 204. A bottom surface of the top channel contact 214 is in direct contact with a top surface of the channel layer 206. Comparing to the top channel contact 214 in FIGS. 1C-1/1D-1, the top channel contact 214 in FIGS. 1C-2/1D-2 has a larger size which in turn provides a bigger process window to dispose a subsequently formed Via over the top channel contact.

Figure 1E:
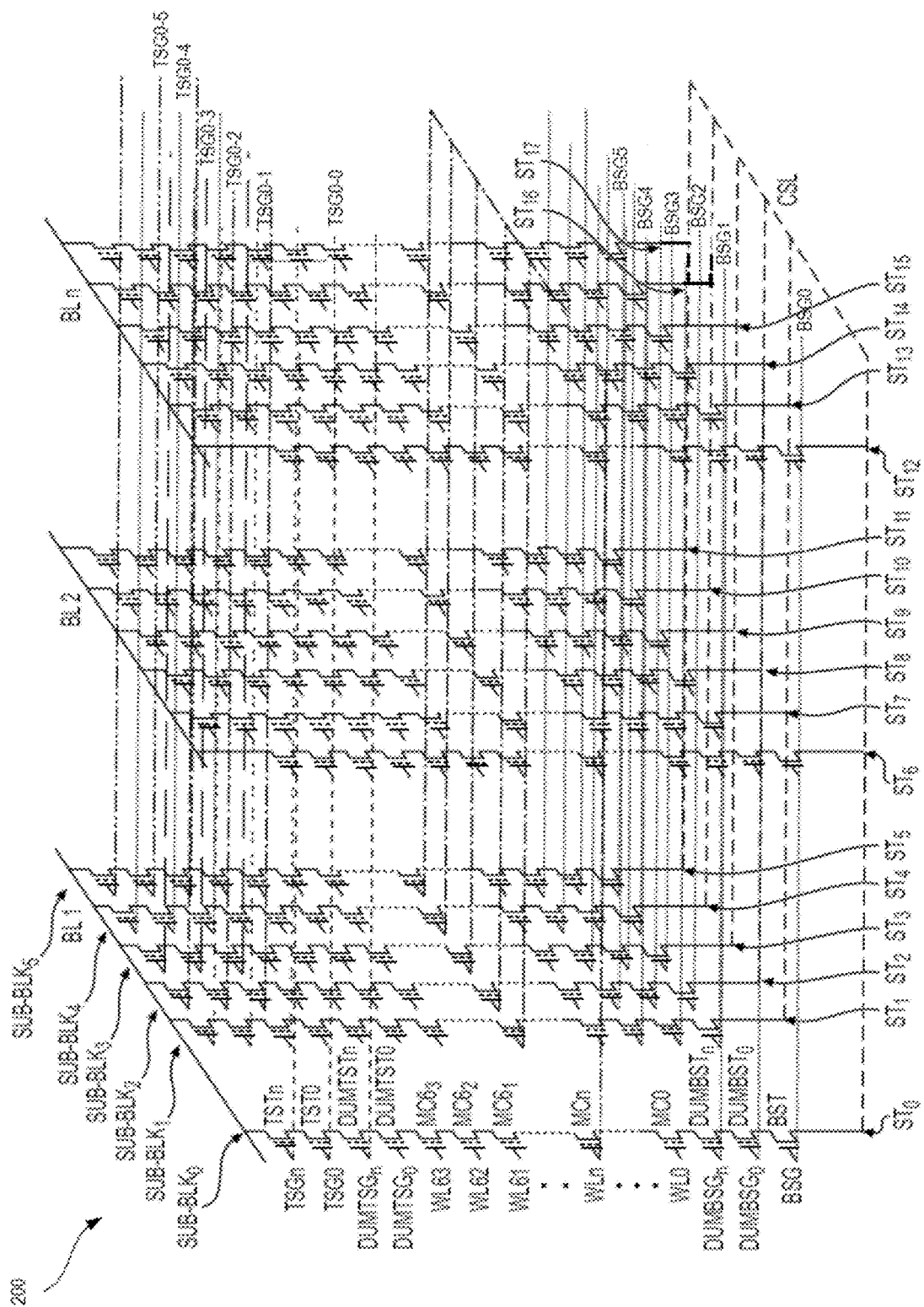
FIG. 1E is an equivalent circuit diagram of a 3D-NAND memory device, in accordance with exemplary embodiments of the disclosure.
Figure 2:
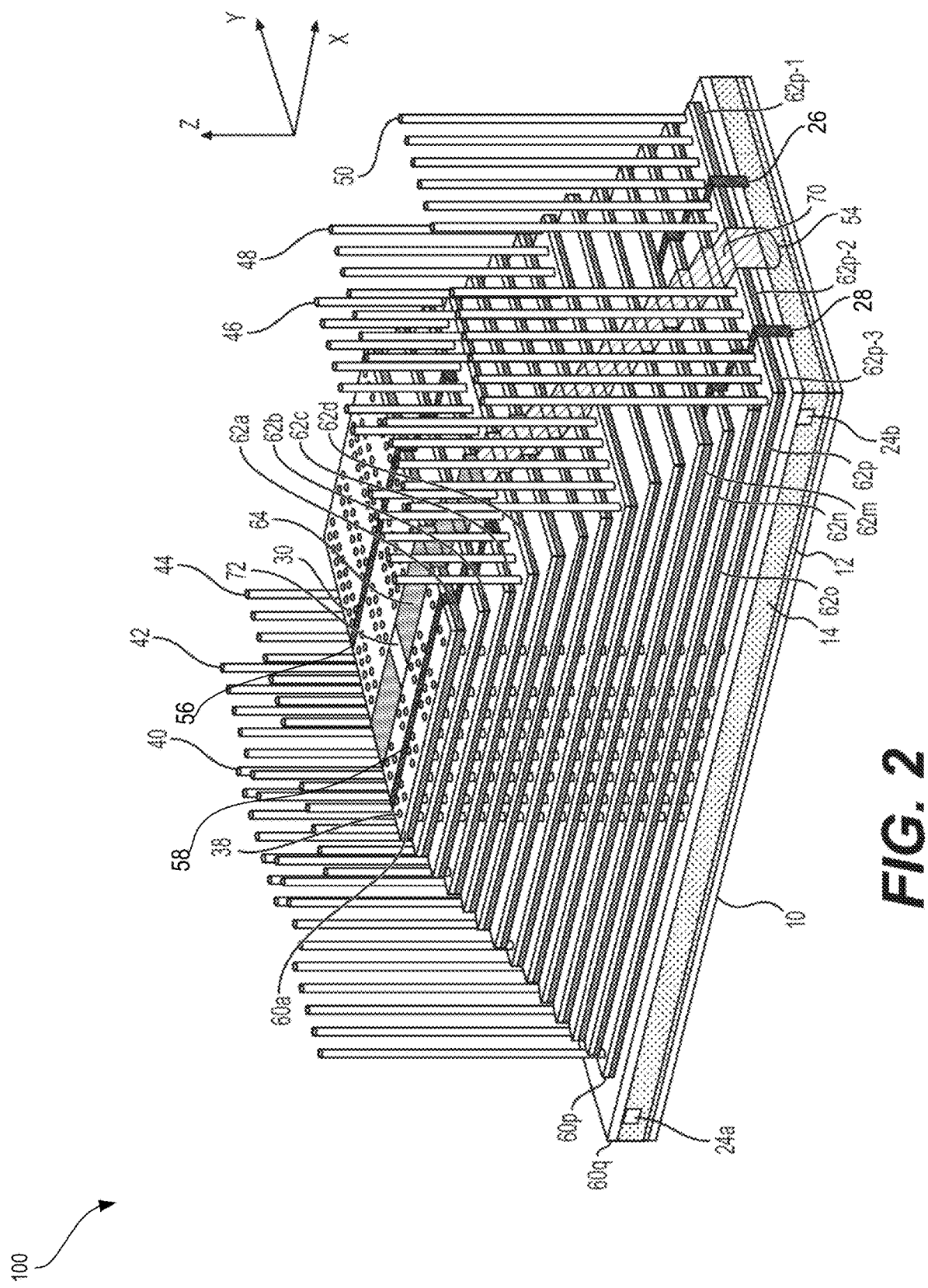

FIG. 1E is an equivalent circuit diagram of a 3D NAND memory device, in accordance with exemplary embodiments of the disclosure. As shown in FIG. 1E, the circuit diagram includes a memory cell block 200 or memory cell array 200. The memory cell block 200 can include a plurality of vertical NAND memory cell strings ST0-ST17. Each of the memory cell strings can have one or more bottom select transistors (BSTs), one or more dummy BSTs (DUMBSTs), a plurality of memory cells (MCs), one or more dummy top select transistors (DUMTSTs), and one or more TSTs. For example, a memory cell string ST0 can have a BST, two dummy BSTs (DUMBST0 and DUMBSTn), 64 memory cells MC0-MC63, two dummy TSTs (DUMTST0 and DUMTSTn), and two TSTs (TST0 and TSTn). A top end of each of the memory cell strings can be a drain region that is connected to a bit line (BL), and a bottom end of each of the memory cell strings can be a source region that is connected to a common source line (CSL). For example, the memory cell string ST0 is connected to a bit line BL1 through the drain region of the TSTn and is connected to a CSL through the source region of the BST.

The memory cell block 200 can be divided into six sub-blocks from SUB-BLK0 to SUB-BLK5 by the first and second trenches that are illustrated in FIG. 1A. Each of the sub-blocks can have a respective set of memory cell strings. For example, SUB-BLK0 can include a set of memory cell strings ST0, ST6 and ST12, and SUB-BLK1 can include another set of memory cell strings ST1, ST7 and ST13.

Figure 3A:
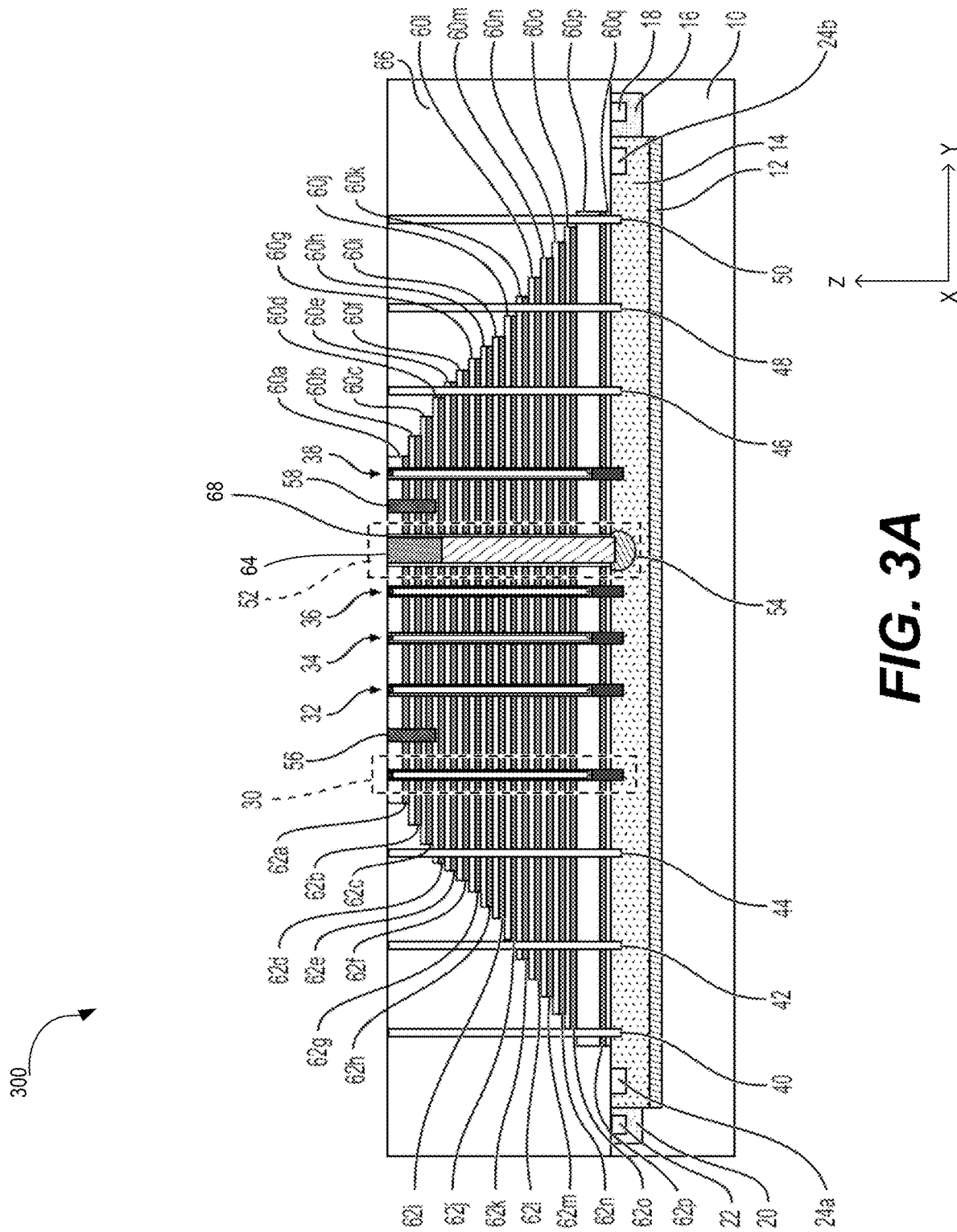
FIG. 3A is a cross-sectional view of a related 3D-NAND memory device, in accordance with exemplary embodiments of the disclosure.
Figure 3B:
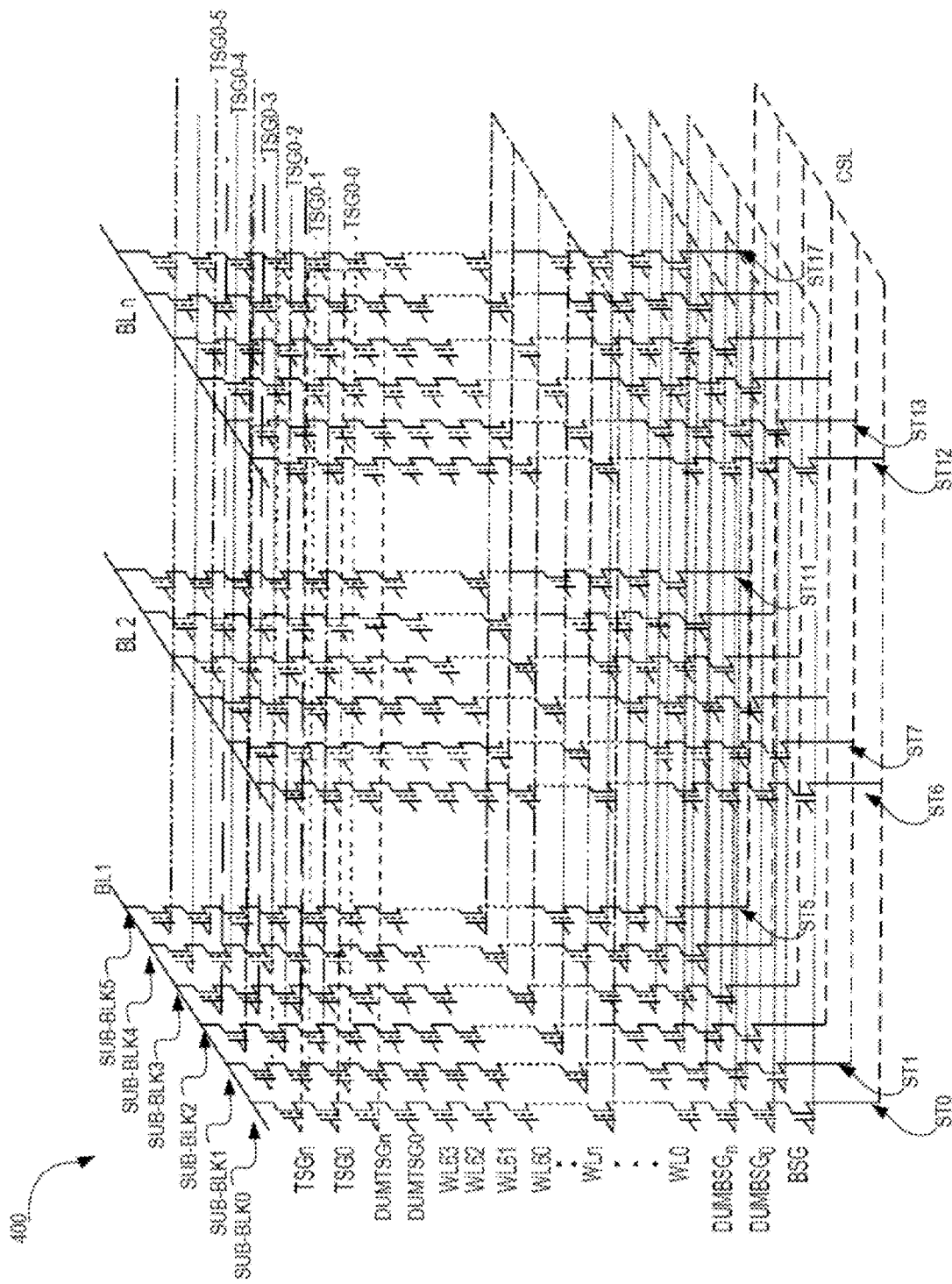
FIG. 3B is an equivalent circuit diagram of the related 3D-NAND memory device, in accordance with exemplary embodiments of the disclosure.

In a related memory cell block, such as a memory cell block 400 shown in FIG. 3B, a bottom select gate (BSG) of each of the memory cell strings are connected to each other and shared. Similarly, a dummy BSG of each of the memory cell strings is also connected to each other and shared. In the memory cell block 200, the bottom select gate BSG and the dummy BSGs (e.g., DUMBSG0 and DUMBSGn) can be separated into a plurality of sub-BSGs and sub-dummy BSGs by the first trenches, such as 26 and 28 illustrated in FIG. 1A. For example, the BSG can be separated by the first trenches into a plurality of sub-BSGs from BSG0 to BSG5. In addition, the top select gates TSGs (e.g., TSG0 and TSGn), and the dummy TSGs (e.g., DUMTSG and DUMTSGn) can be separated into a plurality of sub-TSGs and sub-dummy TSGs by the second trenches, such as 56 and 58 illustrated in FIG. 1A. For example, the TSG0 can be separated by the second trenches into a plurality of sub-TSGs from TSG0-0 to TSG0-5.

Accordingly, the BSTs, the dummy BSTs, the dummy TSTs, and the TSTs in each of the sub-blocks can have respective control gates that are sub-BSGs, sub-dummy BSGs, sub-dummy TSGs and sub-TSGs respectively. For example, in SUB-BLK0, the BSTs of the strings ST0, ST6 and ST12 have an individual control gate of BSG0 that is formed by the first trenches to separate the control gate BSG, and the TST0s of the strings ST0, ST6, ST12 have an individual control gate of TSG0-0 that is formed by the second trenches to separate the control gate TSG. Similarly, in SUB-BLK1, the BSTs of ST1, ST7 and ST13 have a control gate of BSG1 and the TST0s of ST1, ST7 and ST13 have a control gate of TSG0-1. Without the introduction of the first/second trenches, the memory cell block 200 has shared BSG, dummy BSGs, dummy TSGs, and TSG. An exemplary shared BSG is illustrated in FIGS. 3A and 3B where the BSG of each of the memory cell strings are connected to each other and shared.

By introducing such a divided BSG structure, the disclosed 3D-NAND memory device can effectively reduce parasitic capacitance and coupling effects between the BSG and adjacent dielectric layers, and significantly improve $V_t$ performance of the bottom select transistors (BSTs). In addition, the divided BSG structure allows erasing a specific sub-block rather than the entire block 200. Accordingly, the erasing time and data transfer time could be reduced significantly, and data storage efficiency can be improved as well. Further, the divided TSG structure allows reading/ programming a specific sub-block rather than the entire block 200, which in turn reduces the reading/programming time and improves the data transfer/storage efficiency.

In the memory cell block 200, the sub-blocks can share one or more word lines. For example, as shown in FIG. 1E, 18 MCns in six sub-blocks are connected to each other and have a common/shared word line WLn. Similarly, other MCs in all six sub-blocks can also have common/shared word lines.

The each of the sub-blocks can have one or more bit line connections. For example, in sub-block SUB-BLK0, the memory cell string ST0 is connected to BL1, the memory cell string ST6 is connected to BL2, and the memory cell string ST12 is connected to BLn. In the disclosed memory cell block 200, all the 18 memory cell strings are connected to a same CSL (or common source region).

Still referring to FIG. 1E, each of the memory cell strings can be constituted by one or more sub-BSGs, one or more sub-dummy BSGs, a plurality of word lines, one or more sub-dummy TSGs, one or more sub-TSGs, and a channel structure that pass through the sub-TSGs, sub-dummy TSGs, word lines, sub-dummy BSGs, and sub-BSGs, and is electrically coupled to a substrate/a same common source region (i.e., CSL). For example, a memory cell string ST0 can be constituted by a channel structure 30, a sub-BSG 62p-1 (i.e., BSG0 in FIG. 1E), two sub-dummy BSGs 62n-1 and 62o-1, word lines 62d-62m, two sub-dummy TSGs 62b-1 and 62c-1, and a sub-TSG 62a-1 (i.e., TSG0-1 in FIG. 1E), which are illustrated in FIG. 1A. It should be noted that the TSGn is not illustrated in FIG. 1A. Accordingly, the bottom select transistor (BST) of the string ST0 can be constituted by the channel structure 30 and the sub-BSG 62p-1. A memory cell, such as MC63 can be constituted by the channel structure 30 and the world line 62d. The top select transistor TST0 can be formed by the channel structure 30 and the sub-TSG 62a-1. The DUMSTST0 can be formed by the channel structure 30 and the sub-dummy TSG 62c-1. The common source line (CSL) illustrated in FIG. 1E can be the common source region 52 illustrated in FIG. 1A.

FIG. 2 is a schematic perspective view of a 3D NAND memory device, in accordance with exemplary embodiments of the disclosure. As shown in FIG. 2, a plurality of dummy channel structures, such as 40, 42, 44, 46, 48, and 50 are disposed in the staircase regions. A plurality of channel structures, such as 30 and 38, are positioned in the core region. Two first trenches (26 and 28) and two second trenches (56 and 58) are formed along the X-direction, aligned at the Y-direction, and spaced apart from each other by a plurality of word lines 62d-62m. The first trenches separate the BSG 62p, the dummy BSGs (62n and 62o) into a plurality of sub-BSGs and a plurality of sub-dummy BSGs respectively. For example, three sub-BSGs 62p-1, 62p-2, and 62p-3 are included in embodiment shown in FIG. 2. Similarly, the second trenches separate the TSG 62a, the dummy TSGs (62b and 62c) into a plurality of sub-TSGs and a plurality of sub-dummy TSGs respective. A plurality of insulating layers 60a-60q are formed between the substrate, the BSG, the dummy BSGs, the word lines, the dummy TSGs, and the TSG. A common source region 52 is formed along the X-direction and disposed with the first and second trenches in parallel. The common source region 52 passes through the TSG, the dummy TSGs, the word lines, the dummy BSGs, and the BSG, and extends into the substrate 10. The common source region 52 is separated by the H-Cut 72 into two sub common source regions.

FIG. 3A is a cross-sectional view of a related 3D NAND memory device 300 that is obtained along a Z-direction (height direction) of a substrate. Comparing to the memory device 100, the related memory device 300 does not include the first trenches, such as 26 and 28 that are illustrated in FIG. 1A.

FIG. 3B illustrates an equivalent circuit diagram of the related 3D NAND memory device 300. As shown in FIG. 3B, the circuit diagram includes a memory cell block or memory cell array 400. The memory cell block 400 can include six sub-blocks from SUB-BLK0 to SUB-BLK5 by the second trenches, such as 56 and 58 in FIG. 3A. Similar to the memory device 100, the top select gates TSGs (e.g., TSG0 and TSGn), and the dummy TSGs (e.g., DUMTSG0 and DUMTSGn) can be separated into a plurality of sub-TSGs and sub-dummy TSGs by the second trenches. For example, the TSG0 can be separated by the second trenches into a plurality of sub-TSGs from TSG0-0 to TSG0-5. Accordingly, each of the sub-blocks can have respective sub-TSGs and respective sub-dummy TSGs. For example, a sub-block SUB-BLK0 can have a sub-TSG TSG0-0, and a sub-block SUB-BLK1 can have a sub-TSG TSG0-1. The difference between the related memory device 300 and the disclosed memory device 100 is that in the related memory device 300, the BSG or dummy BSGs (e.g., DUMBSG0 and DUMBSGn) in each of the sub-blocks are connected to each other and shared.

Figure 4A:
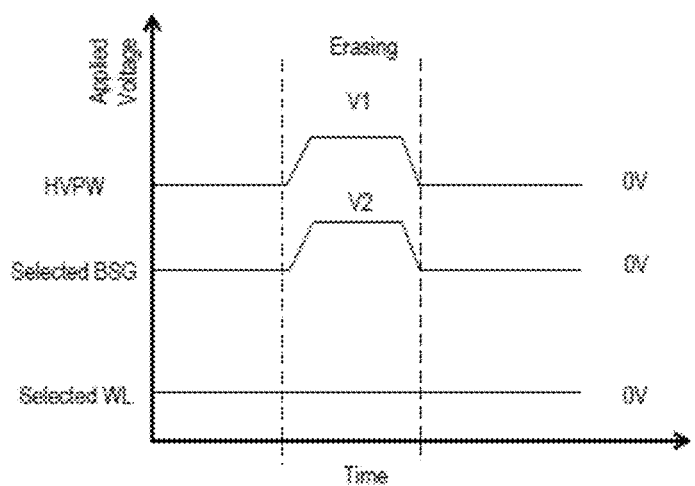
FIG. 4A is a schematic diagram of an operation parameter to erase a related 3D-NAND memory device, in accordance with exemplary embodiments of the disclosure.
Figure 4B:
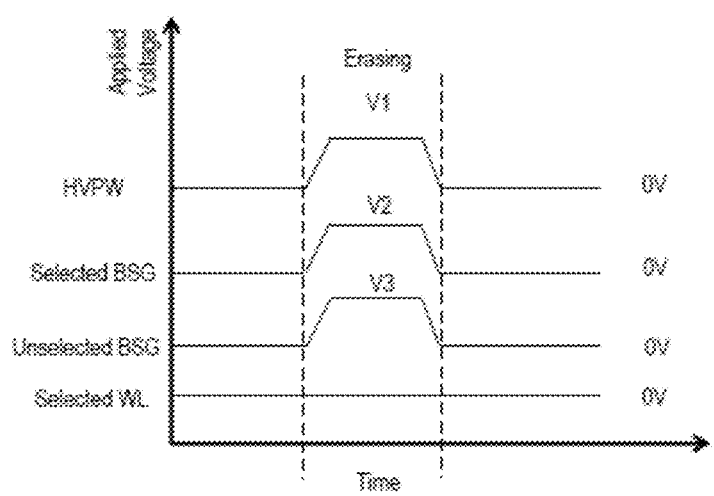
FIG. 4B is a schematic diagram of another operation parameter to erase a 3D-NAND memory device, in accordance with exemplary embodiments of the disclosure.

FIG. 4A is a schematic diagram of an operation parameter to erase a related 3D NAND memory device 300, in accordance with exemplary embodiments of the disclosure. FIG. 4B is a schematic diagram of another operation parameter to erase a 3D-NAND memory device 100, in accordance with exemplary embodiments of the disclosure.

As shown in FIG. 4A, during erasing the related 3D-NAND memory device 300, the word lines that control the memory cells (MCs) are set to an operating voltage equal to zero volt (V). An input voltage applied to the HVPW, such as the HVPW 14 in FIG. 3A, can be set to a first operating voltage V1. The first operating voltage V1 can be positive and have a value between 18 V and 22 V. An input voltage to a selected BSG of a specific sub-block, such as SUB-BLK0 in FIG. 3B, can be set to a second operating voltage V2 that can be lower than the first operating voltage but still positive. For example, the second operating voltage V2 can be in a range from zero volt to 13 V. In addition, the dummy BSGs in the specific sub-block can be set to a switch voltage (not shown in FIG. 4A) that is 0.5 V-2 V lower than the second operating voltage V2. In some embodiments, the selected BSG and the selected dummy BSGs in the specific sub-block can be set to float.

A detailed erasing process can be described base on the channel structure 30 that is illustrated in FIGS. 1C and 1D and the memory cell string ST0/sub-block SUB-BLK0 that is illustrated in FIGS. 1E and 3B. It should be mentioned again, the memory cell string ST0 can be constituted by the channel structure 30 and the surrounding BSG, dummy BSGs, word lines, dummy TSGs, and TSG that are illustrated in FIGS. 1C and 1D.

As shown in FIGS. 1C and 1D, when the first operating voltage is applied to the HVPW 14, the first operating voltage V1 is electrically coupled to the channel layer 206 via the bottom channel contact 202. Because the word lines 62d-62m are all set to an operating voltage equal to zero volt, the channel layer 206 forms a relatively high electric potential with respect to the word lines. The formed high electric potential attracts the electrons that are trapped in the trapping layer 210 back to the channel layer 206. In addition, holes can be injected into the channel layer by the first operating voltage V1 from the HVPW 14/common source region 52. The injected holes can sustain a positive potential in the channel layer and further recombine with the attracted electrons in the channel layer 206. When the electron-hole recombination is completed, the memory cell string ST0 is erased. Accordingly, the input voltages V1, V2 are set to zero volt.

During the easing operation, the selected BSG is either set to float or set to the second operating voltage V2 that allows the selected BSG to stay at a positive voltage relatively lower than the first voltage V1 that is applied to the HVPW 14. Such a relative lower voltage can reduce the electric filed across the gate dielectric (e.g., gate dielectric layer 216 shown in FIG. 1C) and the reduced electric field in turn can prevent the gate dielectric layer from breaking down. In some embodiments, the second voltage V2 applied to the selected BSG can further help generate hole through a gate induced drain leak (GIDL) effect and improve the holes to flow from the substrate to a top portion of the channel layer 206 (e.g., a position close to the TSG).

In some embodiments, the dummy BSGs are either set to float or set to the switch voltages (not shown). The applied switch voltages can be reduced gradually in the direction from BSG 62p toward word line 62m. A gradual reduction in the voltage on dummy BSGs in the direction from BSG toward word lines may reduce the electric field between the BSG (set at a high voltage) and word lines (set at a low voltage, such as zero), hence reducing carrier generation between BSG and word lines and eliminating erase disturb.

Since the related memory device 300 has a common or shared BSG, when the second voltage V2 is applied to the BSG of string ST0/SUB-BLK0 during the easing operation, the bottom select transistors (BSTs) in rest of 17 memory cell strings ST1-ST17 can also be affected and turned on by the second operating voltage V2. Correspondingly, the erasing operation can take place in all six sub-blocks. As the 3D-NAND memory device migrates to higher capacity with an increasing block size, the common/shared BSG can induce longer erasing time, longer data transfer time, and lower storage efficiency.

FIG. 4B is a schematic diagram of another operation parameter to erase a 3D NAND memory device 100. As shown in FIG. 1E, each of the sub-blocks illustrated in FIG. 1E can have a respective sub-BSG that is formed by introducing the first trenches to separate the BSG. When an erasing operation is started, the second voltage V2 can be applied to a respective sub-BSG of a selected sub block. For example, if the SUB-BLK0 is selected, the second voltage V2 can be applied to the corresponding sub-BSG BSG0. In addition, a third voltage V3 can be applied to a respective sub-BSG of an un-selected sub block. For example, if the SUB-BLK1 is un-selected, the third voltage V3 can be applied to the corresponding sub-BSG BSG1. The third voltage V3 can be close to the first voltage V1 and higher than the second voltage V2. For example, the V3 can be ranged from 18 V to 25 V. The relative higher third voltage V3 with respect to the second voltage V2 can repeal the holes that are generated from the HVPW/substrate and inhibiting the holes from flowing into the channel layer of the un-selected sub-block. Accordingly, the erasing process can take place in the selected sub-block only, and the erasing time and data transfer time could be reduced significantly, and data storage efficiency can be improved as well.

FIGS. 5A through 11D are cross-sectional and top down views of various intermediary steps of manufacturing a 3D-NAND memory device 100 in accordance with exemplary embodiments of the disclosure.

Figure 5A:
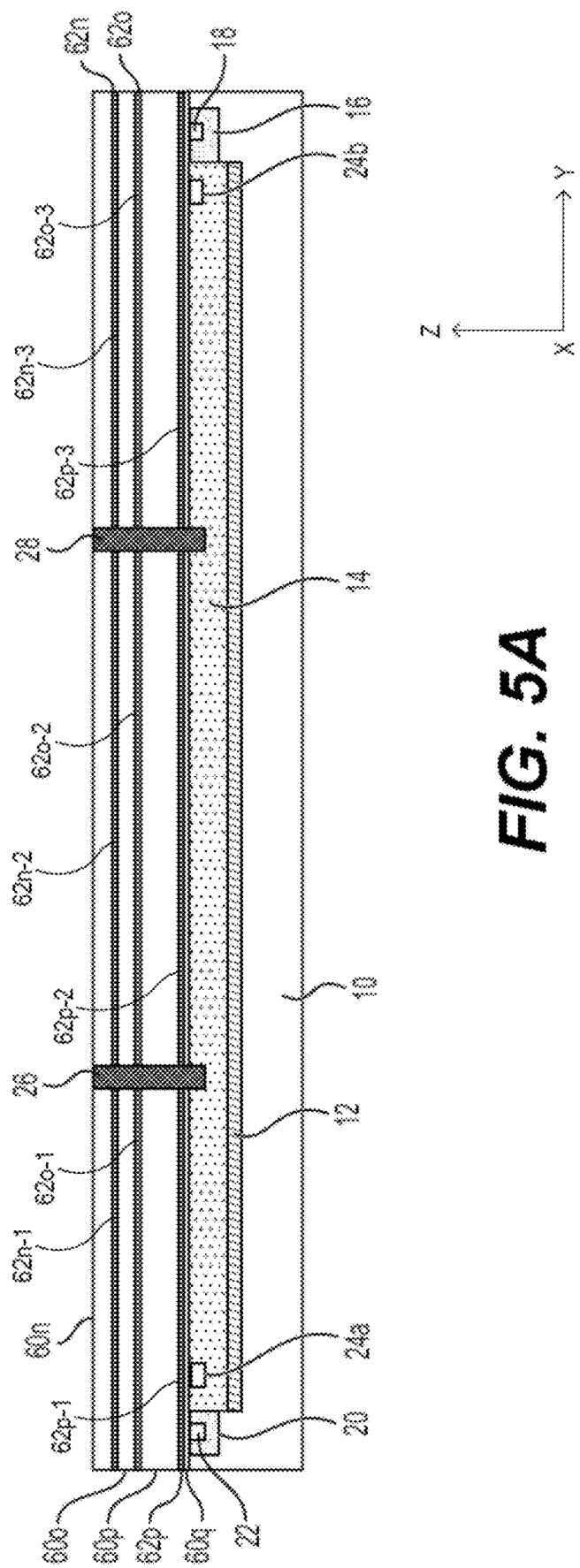
FIGS. 5A through 11D are cross-sectional and top down views of various intermediary steps of manufacturing a 3D-NAND memory device, in accordance with exemplary embodiments of the disclosure.

FIG. 5A is a cross-sectional view that is obtained along a Z-direction (i.e., height direction) of a substrate. As shown in FIG. 5A, a plurality of doped regions 12, 14, 16, 18, 20, 22, and 24 are formed in a substrate 10 based on a photolithography process and a doping and/or ions implantation process. The doped regions in FIG. 5A may be substantially similar to the doped regions discussed above with reference to FIG. 1A. In order to form the doped regions, a patterned mask can be formed over the substrate by the photolithography process. The patterned mask exposes desired regions of the substrate that need dopant. A doping process, such as an ion implantation process, an in situ doped epitaxial growth, a plasma doping process (PLAD), or other methods as known in the art, can be applied to transfer suitable dopant into the exposed regions of the substrate 10. A dopant concentration, a doping profile, and a doping depth can be controlled by adjusting the energy, angle and dopant type of the doping process.

Over the substrate 10, a bottom select gate (BSG) 62p, two dummy BSGs 62n-62o, and a plurality of first insulating layers 62n-62q can be subsequently formed. The substrate 10, BSG 62p and the dummy BSGs 62n-62o are spaced apart from each other by the first insulating layers 60n-60q.

The BSG 62p and the two dummy BSGs 62n-62o can be sacrificial layers that are made of SiN. The sacrificial layers can be removed and replaced with a high K layer and a metal layer in future manufacturing steps. The BSG 62p and the two dummy BSGs 62n-62o can have a thickness in a range from 10 nm to 100 nm. The first insulating layer can include SiO, SiCN, SiOCN, or other suitable materials. The first insulating layers 60n-60q can have a thickness from 5 nm to 50 nm. Any suitable deposition process can be applied to form the BSG, the dummy BSGs and the first insulating layers, such as chemical vapor deposition (CVD), physical vapor deposition (PVD), atomic layer deposition (ALD), diffusion, or any combination thereof.

Still referring to FIG. 5A, two first trenches 26 and 28 can be formed in the BSG 62p and dummy BSGs 62n-62o when the BSG, dummy BSGs and the first insulating layers are stacked over the substrate 10. The first trenches 26 and 28 extends in a X-direction (i.e., a length direction) of the substrate 10 to separate the BSG 62p and the dummy BSGs 62n-62o into a plurality of sub-BSGs and sub-dummy BSGs. For example, three sub-BSGs 62p-1 to 62p-3, and three sub-dummy BSGs 62n-1 to 62n-3 are included in FIG. 5A.

The first trenches 26 and 28 can have a CD from 50 nm to 150 nm. The first trenches can be filled with $SiO_2$, SiON, SiOCN, or other suitable dielectric materials. In some embodiments, the first trenches 26 and 28 can extend into the HVPW 14 with a depth between 10 nm and 100 nm. The first trenches can be formed by a photolithography process, a subsequent etching process, filling with dielectric materials then CMP (Chemical Mechanical Polish) when necessary. For example, a patterned mask stack can be formed over the insulating layer 60n by the photolithography process. A subsequent etching processing can be introduced to etch through the insulating layers, the BSG, the dummy BSGs and further extend into the HVPW 14 to form two trench openings. The trench openings then can be filled with a dielectric material, such as $SiO_2$, SiON, SiOCN, or other suitable materials by applying a chemical vapor deposition (CVD), physical vapor deposition (PVD), atomic layer deposition (ALD), diffusion, or any combination thereof. A surface planarization may be performed to remove any excessive dielectric materials over the insulating layer 60n.

Figure 5B:
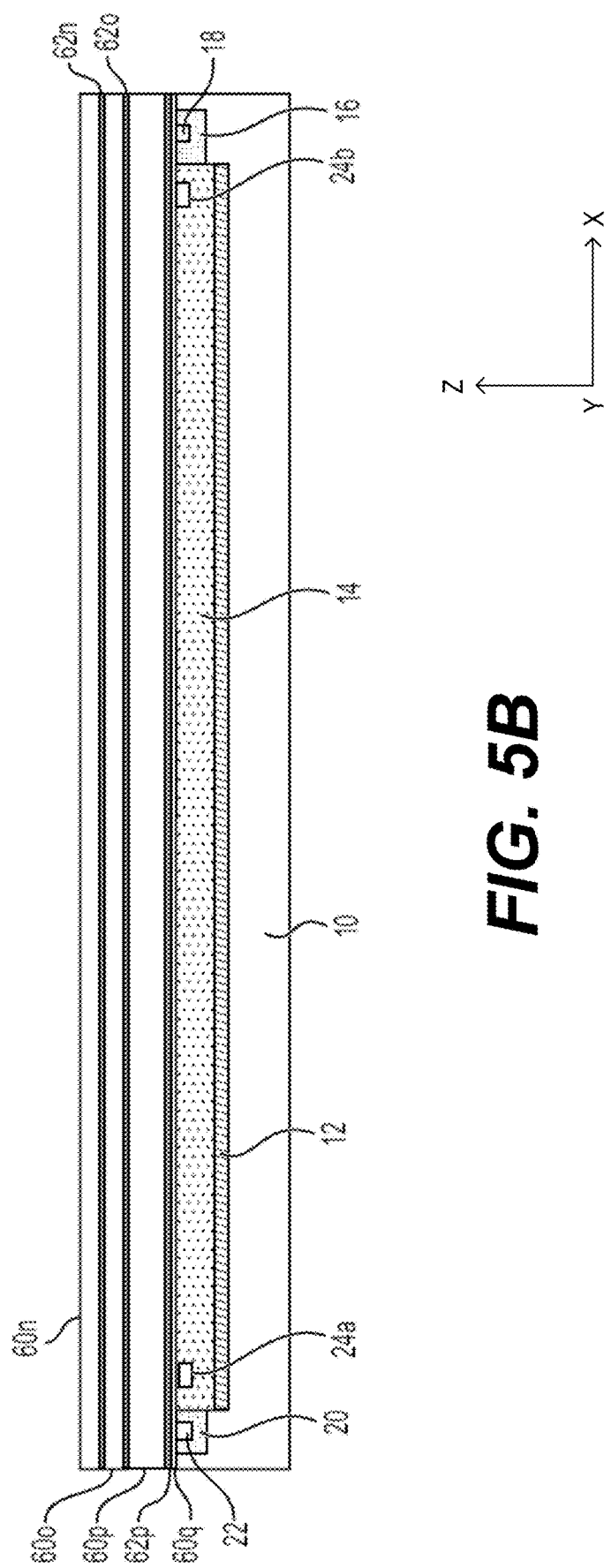
Figure 5C:
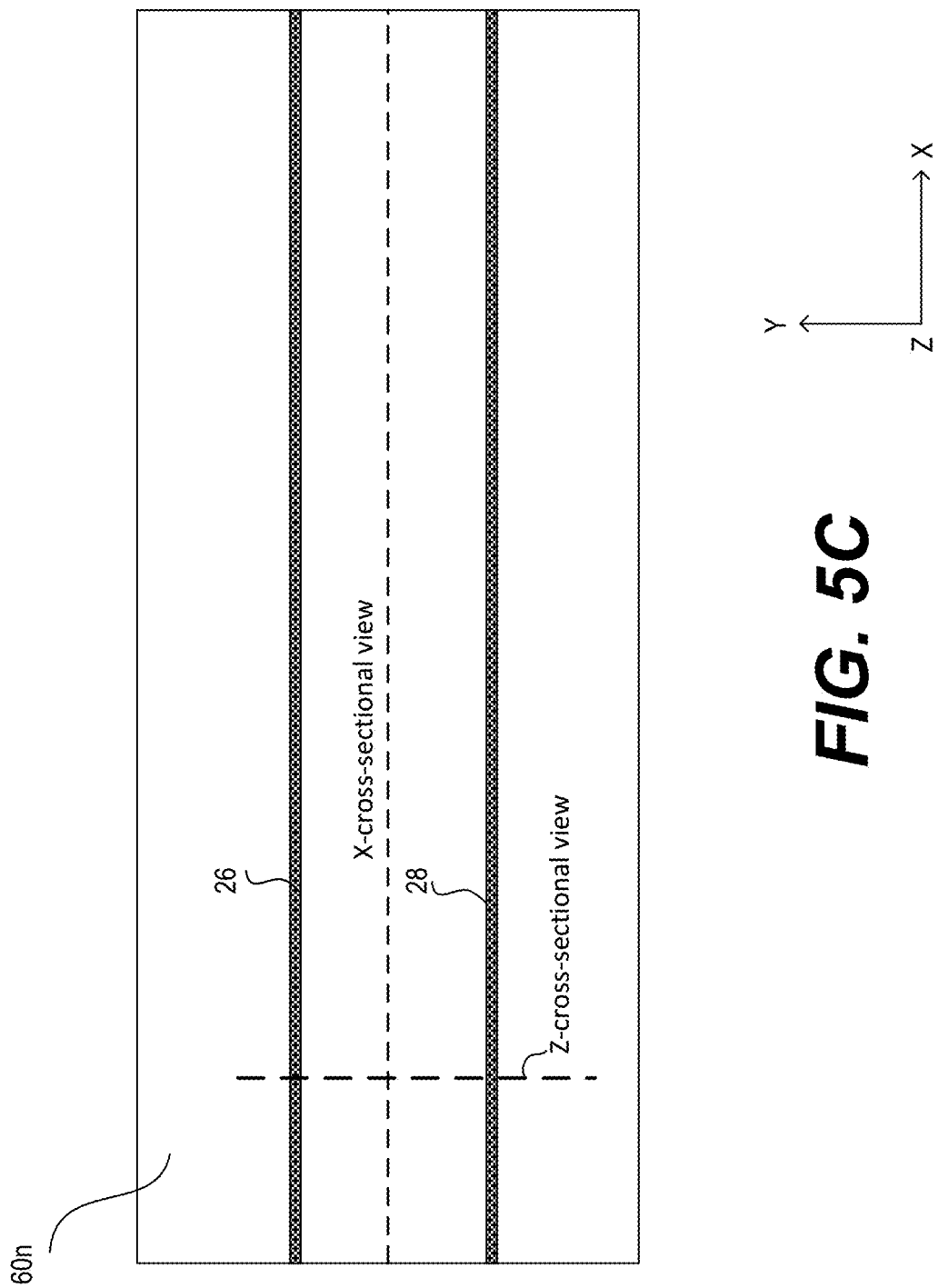

FIG. 5B is cross-sectional view that is obtained along an X-direction (a length direction) of the substrate, and FIG. 5C is a top down view to illustrate a final structure when the first trenches 26 and 28 are formed. As shown in FIG. 5B, the first trenches 26 and 28 cannot be observed when the cross-sectional view is made along the X-direction (length direction) of the substrate 10. In FIG. 5C, the insulating layer 60n is shown as a top surface and the two first trenches 26 and 28 extend along the length direction of the substrate and further separate the substrate 10 into three equal regions.

Figure 6:
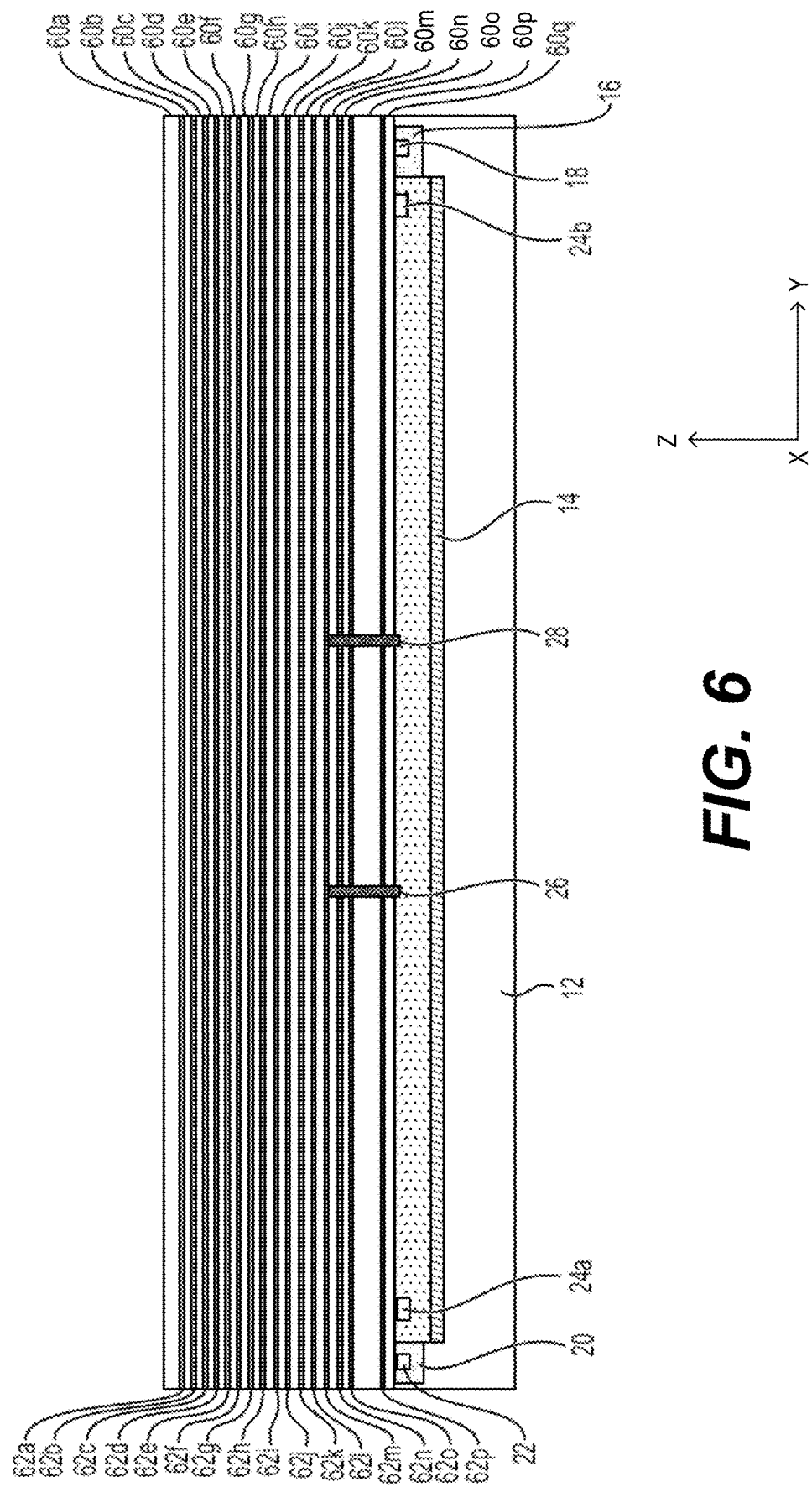

In FIG. 6, a plurality of word lines 62d-62m, two dummy top select gates (TSGs) 62b-62c, and a TSG 62a are sequentially formed on the first insulating layer 60n. A plurality of second insulating layers 60a-60m are also deposited over the first insulating layer 60n. The world lines 62d-62m, the dummy TSGs 62b-62c, and the TSG 62a are spaced apart from each other by the second insulating layers 60a-60m. The world lines 62d-62m, the dummy TSGs 62b-62c, and the TSG 62a can be sacrificial layers that are made of SiN and have a thickness in a range from 10 nm to 100 nm. The sacrificial layers can be removed and replaced with a high K layer and a metal layer in the future manufacturing steps. The second insulating layers 60a-60m can have a thickness between 5 nm and 50 nm, and include $SiO_2$, SiCN, SiOCN, or other suitable materials. Any suitable deposition process can be applied to form the TSG, the dummy TSGs and the second insulating layers, such as chemical vapor deposition (CVD), physical vapor deposition (PVD), atomic layer deposition (ALD), diffusion, or any combination thereof.

Figure 7A:
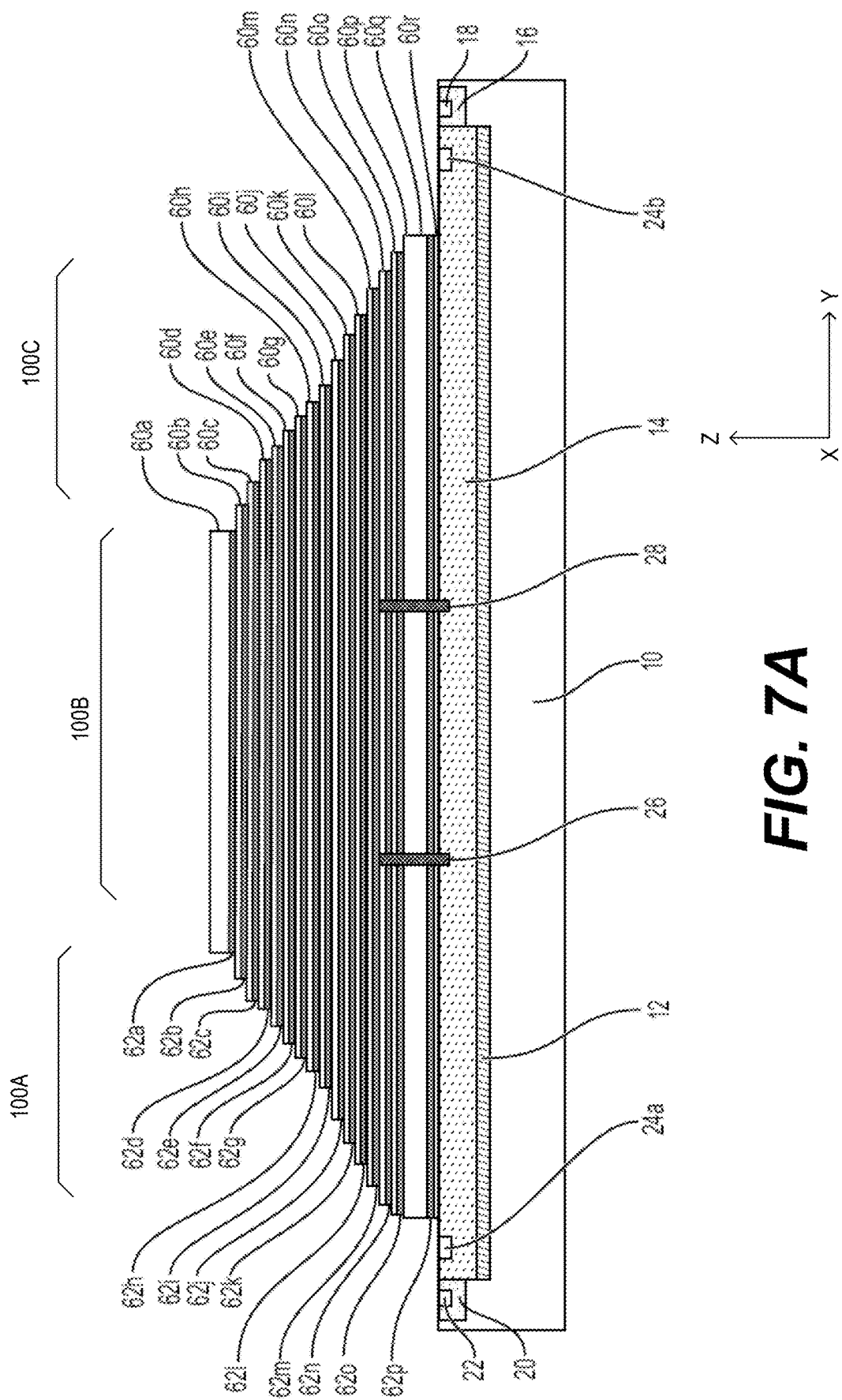
Figure 7B:
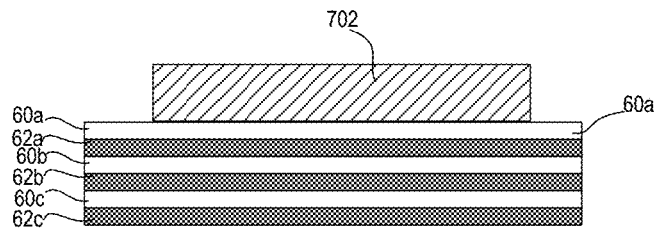

In FIG. 7A, two staircase regions 100A and 100C are formed. The formation of the two staircase regions 100A and 100C can be illustrated in exemplary manufacturing steps that are shown in FIGS. 7B-7F. As shown in FIG. 7B, a plurality of word sacrificial lines 62a-62c and a plurality of insulating layers 60a-60c can be formed and disposed alternatively. A patterned mask stack 702 can be formed on the insulating layer 60a. The patterned mask stack 702 exposes two end portions of the insulating layer 60a. The mask stack 702 can include an amorphous carbon hard-mask layer, a dielectric anti-reflective coating (DARC), a bottom anti-reflective coating (BARC) layer, and a photoresist layer. In some other embodiments, the mask stack 702 can be only photoresist for staircase formation. The mask stack 702 can be patterned according to any suitable technique, such as a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), and the like.

Figure 7C:
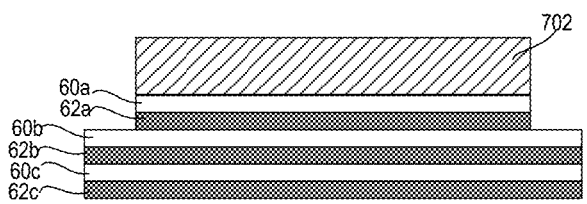
Figure 7D:
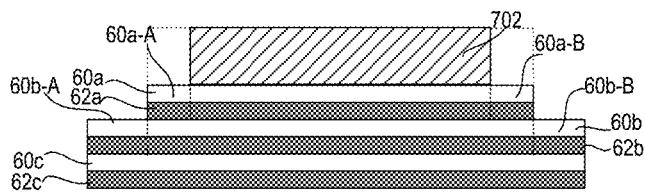

In FIG. 7C, a first plasma etching process can be performed to remove the exposed end portions of the insulating layer 60a. The first plasma etching process further removes portions of underlying word line 62a that are not protected by the mask stack 702 and stops on the insulating layer 60b by a precise process control. In FIG. 7D, a trim process can be applied to remove portions of the mask stack 702 from two ends to expose the insulating layer 60a further. The exposed portions of the insulating layer 60a can be two end portions 60a-A and 60a-B. In addition, the insulating layer 60b can have exposed end portions 60b-A and 60b-B.

Figure 7E:
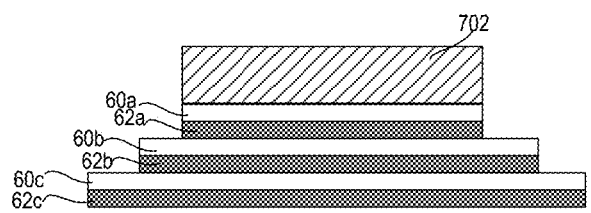
Figure 7F:
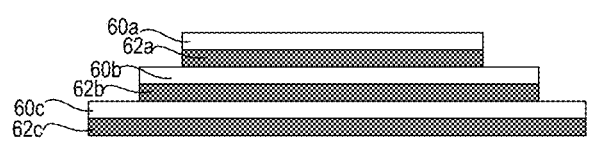

In FIG. 7E, a second etching process can be performed. The second etching process can remove the exposed end portions 60a-A and 60a-B from insulation layer 60a. By precisely controlling the second etching process either through an etching time or end point traces, the second etching process further removes portions of word line 62a under the 60a-A and 60a-B and stops on the insulating layer 60b. In the meanwhile, the exposed end portions 60b-A and 60b-B from insulating layer 60b and portions of word line 62b under the 60b-A and 60b-B can be removed simultaneously. Upon the completion of the second etching process, two staircase regions can be formed at two sides. In FIG. 7F, a subsequent plasma ashing can be applied to remove the remaining mask stack 702. Briefly, a multi-cycle Trim-Etch process on multiple masks (As illustrated in FIGS. 7B-7F) can be applied to form the staircase 100A and 100C in FIG. 7A.

Figure 8A:
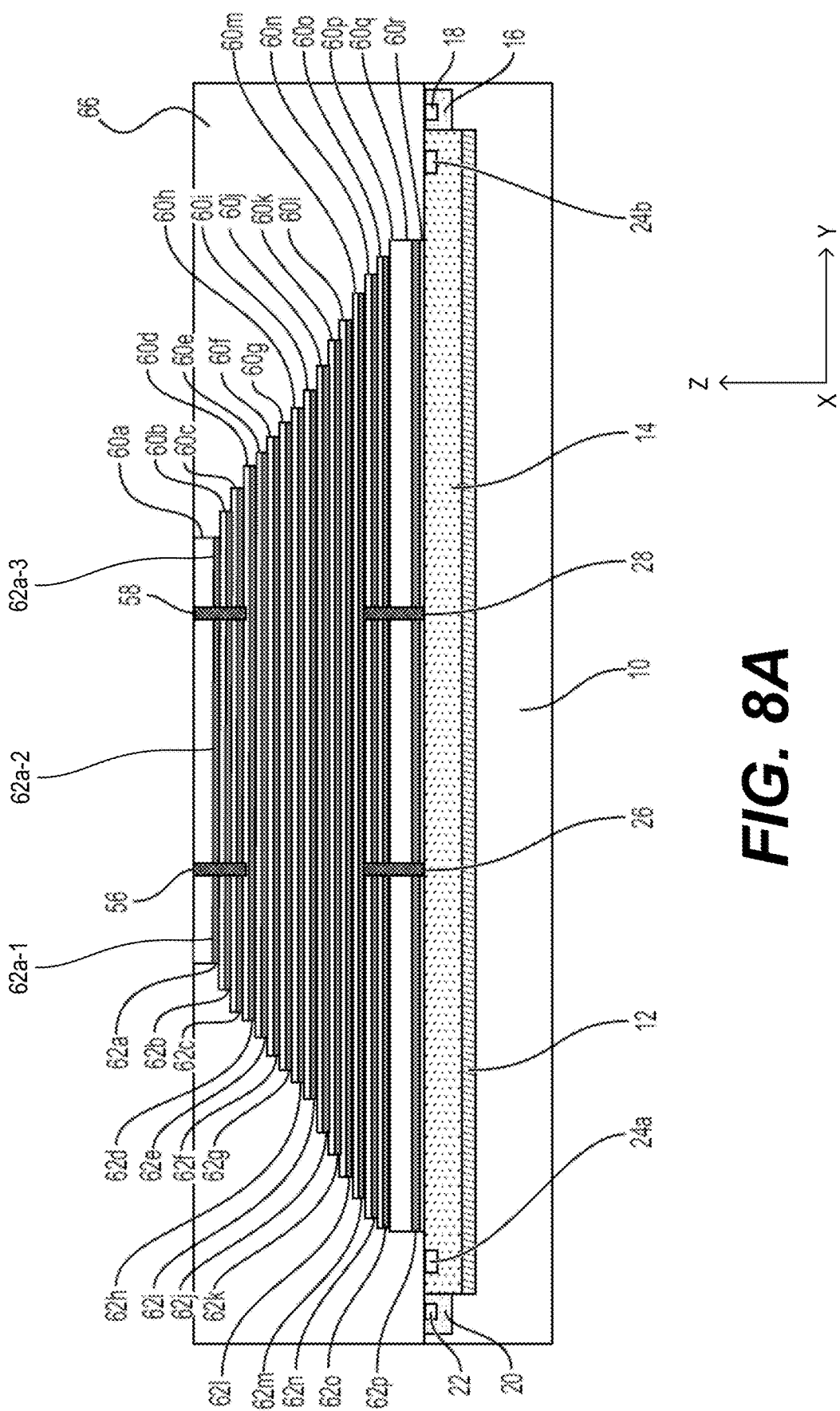

In FIG. 8A, two second trenches 56 and 58 can be formed in the TSG 62a and dummy TSGs 62b-62c. The second trenches 56 and 58 extend in the X-direction (i.e., a length direction) of the substrate 10 to separate the TSG 62a and the dummy TSGs 62b-62c into a plurality of sub-BSGs, and a plurality of sub-dummy BSGs respectively. For example, three sub-BSGs 62a-1, 62a-2, and 62a-3 can be included in FIG. 8A. In some embodiments, the second trenches 56 and 58 can be aligned with the first trenches 26 and 28 in the Y-direction (width direction) of the substrate.

The second trenches 56 and 58 can have a CD 50 nm to 150 nm and include $SiO_2$, SiON, SiOCN, or other suitable dielectric materials. The second trenches can be formed by a photolithography process and a subsequent etching process. For example, a patterned mask stack can be formed over the insulating layer 60a based on the photolithography process. The subsequent etching processing is introduced to etch through the insulating layers 60a-60d, the TSG 62a, the dummy BSGs 62b-62c and stop on the word line 62d to form two trench openings. The trench openings then can be filled with a dielectric material, such as $SiO_2$, SiON, SiOCN, or other suitable materials by applying a chemical vapor deposition (CVD), physical vapor deposition (PVD), atomic layer deposition (ALD), diffusion, or any combination thereof. A surface planarization, such as a CMP process, can be performed to remove any excessive dielectric materials over the insulating layer 60a. After the surface planarization, the dielectric material that remains in the trench openings forms the second trenches.

Figure 8B:
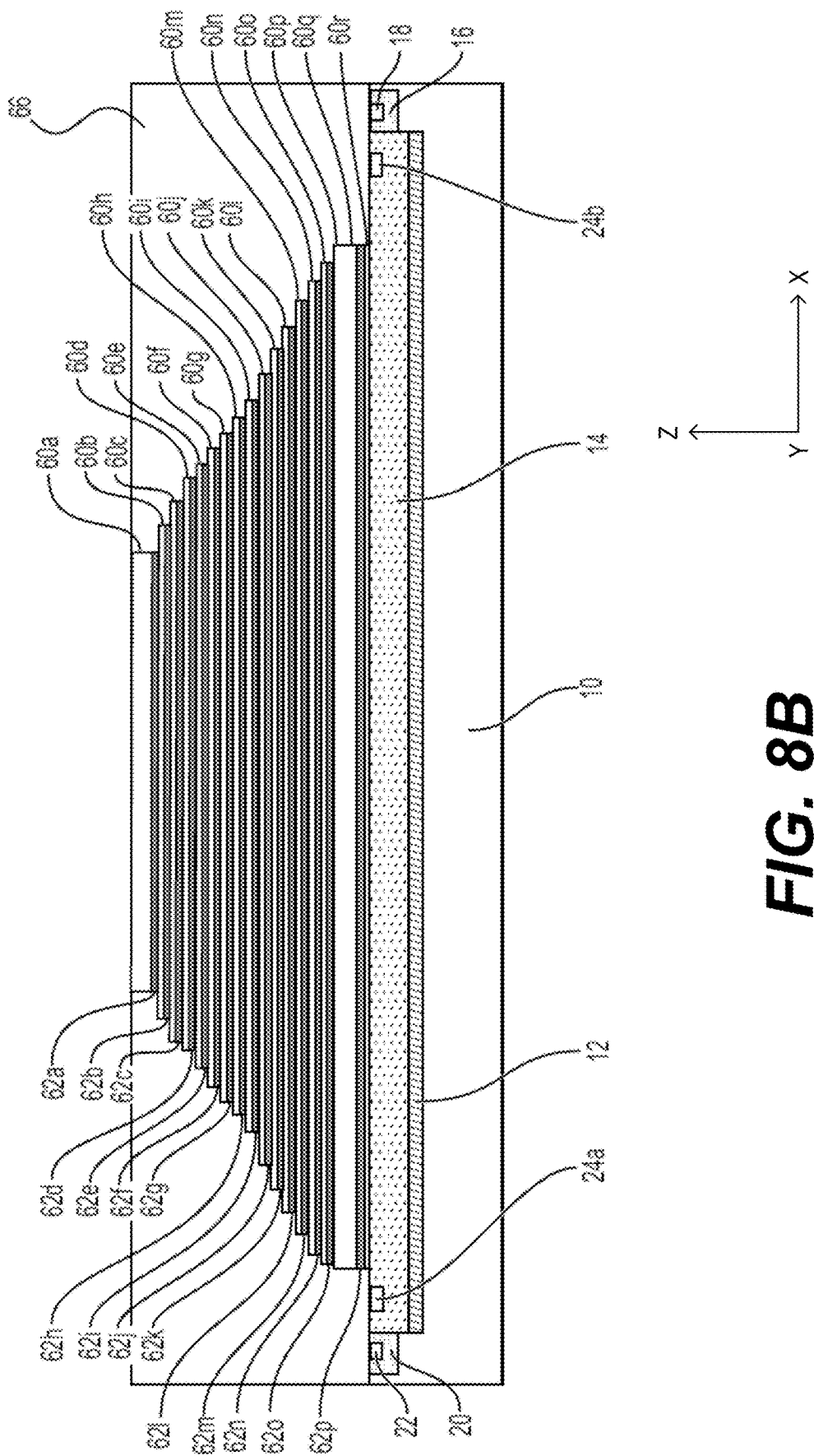
Figure 8C:
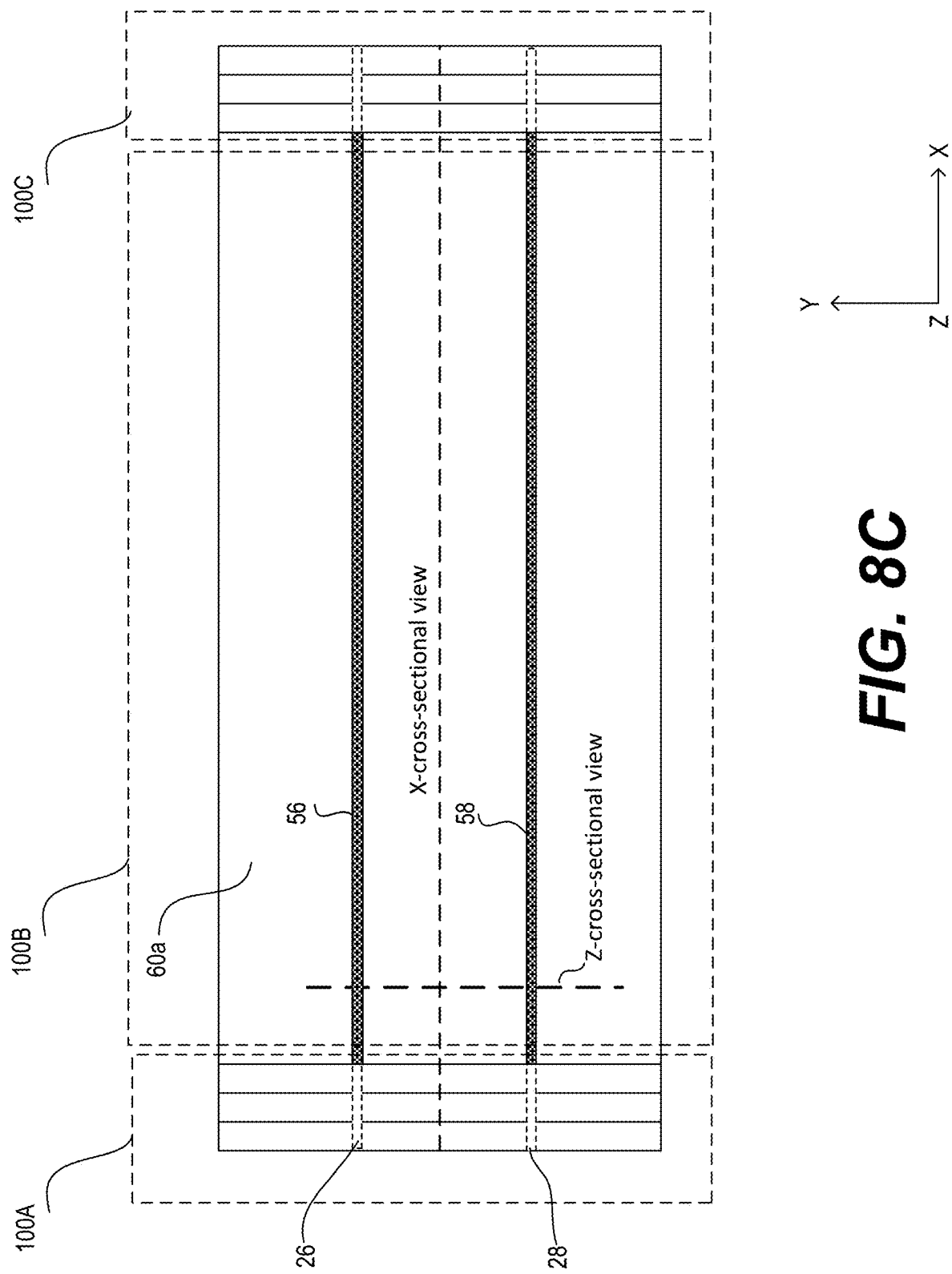

FIG. 8B is cross-sectional view that is obtained along the X-direction (length direction) of the substrate, and FIG. 8C is a top down view to illustrate a final structure when the second trenches 56 and 58 are formed. As shown in FIG. 8B, both the first and the second trenches cannot be observed when the cross-sectional view is made along the X-direction (length direction) of the substrate 10. In FIG. 8C, the insulating layer 60a is a top layer. The second trenches 56 and 58 are formed along the length direction of the substrate and further are aligned with the first trenches 26 and 28 in the Y-direction (width direction) of the substrate 10. The first trenches and the second trenches together separate the substrate 10 into three regions (or sub-blocks). In addition, two staircase regions 100A and 100C are positioned at two sides and a core region 100C is positioned in middle of the substrate.

Figure 9A:
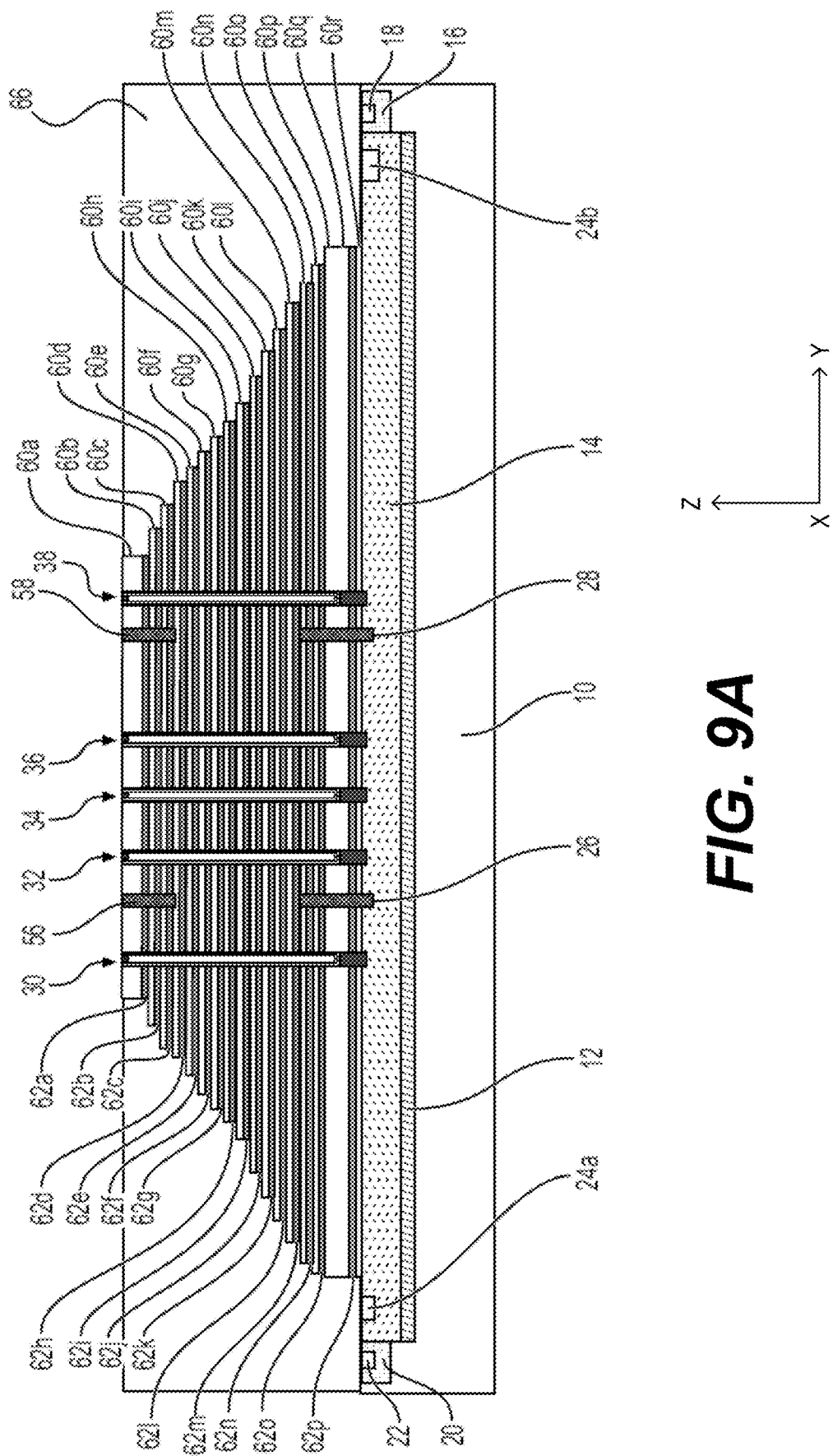

FIG. 9A is a cross-sectional view obtained in the Z-direction (height direction) of the substrate to illustrate the formation of a plurality of channel structures. In order to form the channel structures, a plurality of channel openings can be formed firstly. The channel openings can be formed through a photolithography process to form a patterned mask and a subsequent etching process to transfer the patterns of the mask. The formed channel openings can pass through the TSG, the dummy TSGs, the word lines, the dummy BSGs, and the BSG, and further extend into the HVPW 14. Each of the channel openings can have side portions and a bottom portion to expose the HVPW 14. When the channel openings are formed, a plurality of bottom channel contacts, such as the bottom channel contact 202 illustrated in FIG. 1C, can be formed at the bottom portions of the channel openings. Each of the channel openings can have a respective bottom contact at the bottom portion. The bottom channel contacts can protrude from the BSG 62p, and a top surface of each of the bottom channel contacts can be positioned between the BSG 62p and the dummy BSG 62o.

Still referring to FIG. 9A, once the bottom channel contacts are formed, a barrier layer, a charge trapping layer, and a tunneling layer can be formed sequentially along the side portions of the channel openings and over the bottom channel contacts. A subsequent anisotropic plasm etching can be applied to remove portions of the barrier layer, the charge trapping layer, and the tunneling layer that are disposed over the bottom channel contacts to form a plurality of interconnect opening. Each interconnect opening exposes a respective bottom channel contact. A channel layer can be formed subsequently along the side portions of the channel openings and further extends through the interconnect openings to connect the bottom channel contacts.

Once the channel layer is formed, the channel layer can have side portions that are formed along the tunneling layer and a T-shape bottom portion that extends through bottom portions of the tunneling layer, the charge trapping layer, and the barrier layer that are positioned over the bottom channel contact. The T-shape bottom portion of the channel layer is in direct contact with the bottom channel contact, which can be shown in FIGS. 1C and 1D. In addition, the tunneling layer, the charge trapping layer, and the barrier layer can form an L-foot configuration in the channel openings. The L-foot configuration can include side portions that are formed along the sidewalls of the channel openings and a bottom portion over the bottom channel contacts.

In some embodiments, once the channel layer is formed, a subsequent annealing process can be applied, one is to release wafer stress, the other is to reduce defects (dangling bonds), in some cases, it's also to transform the channel layer into polycrystalline. In some embodiments, the formation of the channel structure further includes forming a channel insulating layer over the channel layer to fill the channel openings, and forming a top channel contact over the channel insulating layer and the top channel contact is in direct contact with the channel layer. A detailed channel structure can be illustrated in FIGS. 1C and 1D.

Figure 9B:
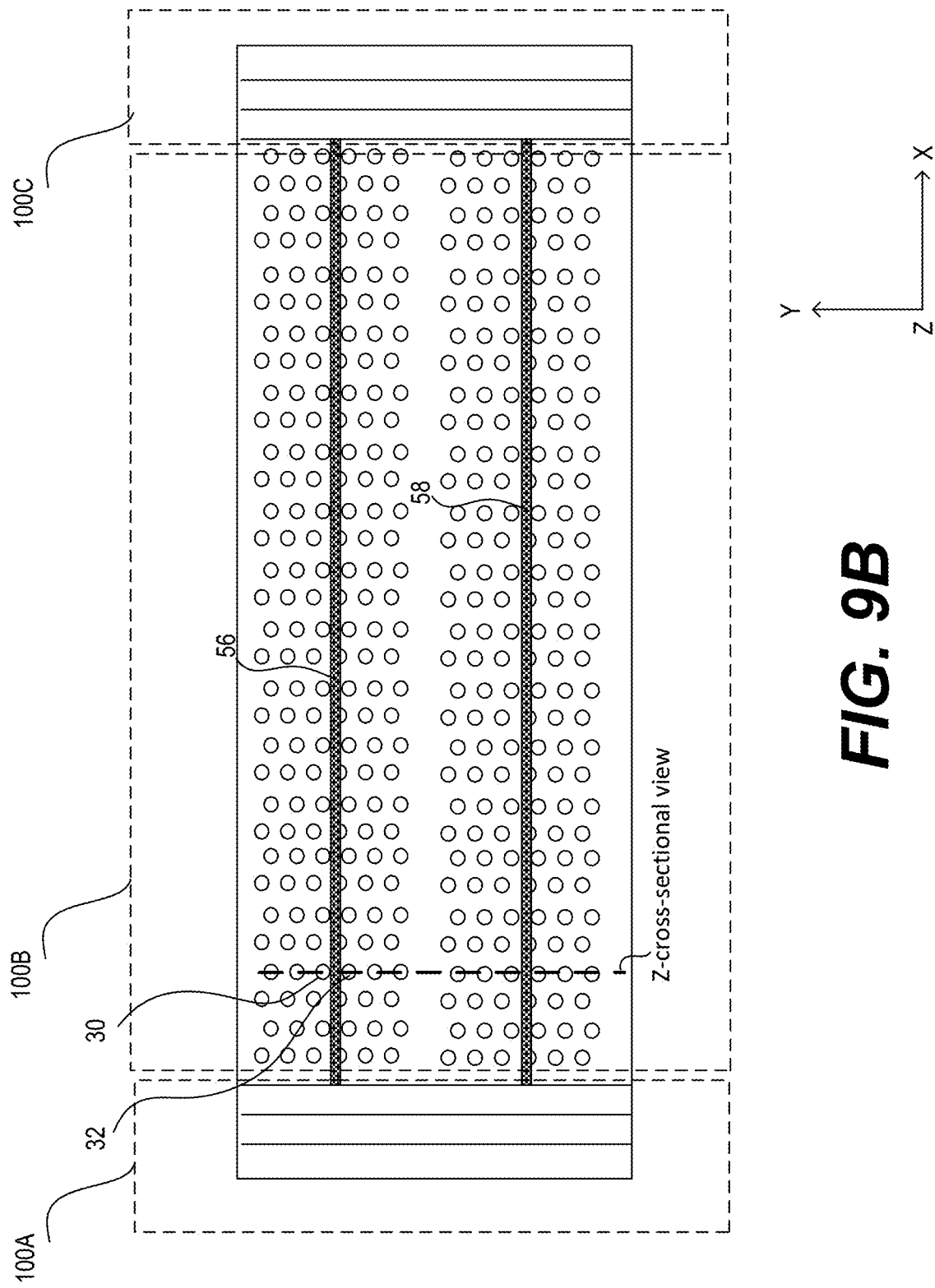

FIG. 9B is top down view to illustrate the formation of a plurality of channel structures. As shown in FIG. 9B, the plurality of channel structures can be formed in the core region 100B and separated by the second trenches 56 and 58 into 3 sub-blocks.

Figure 10A:
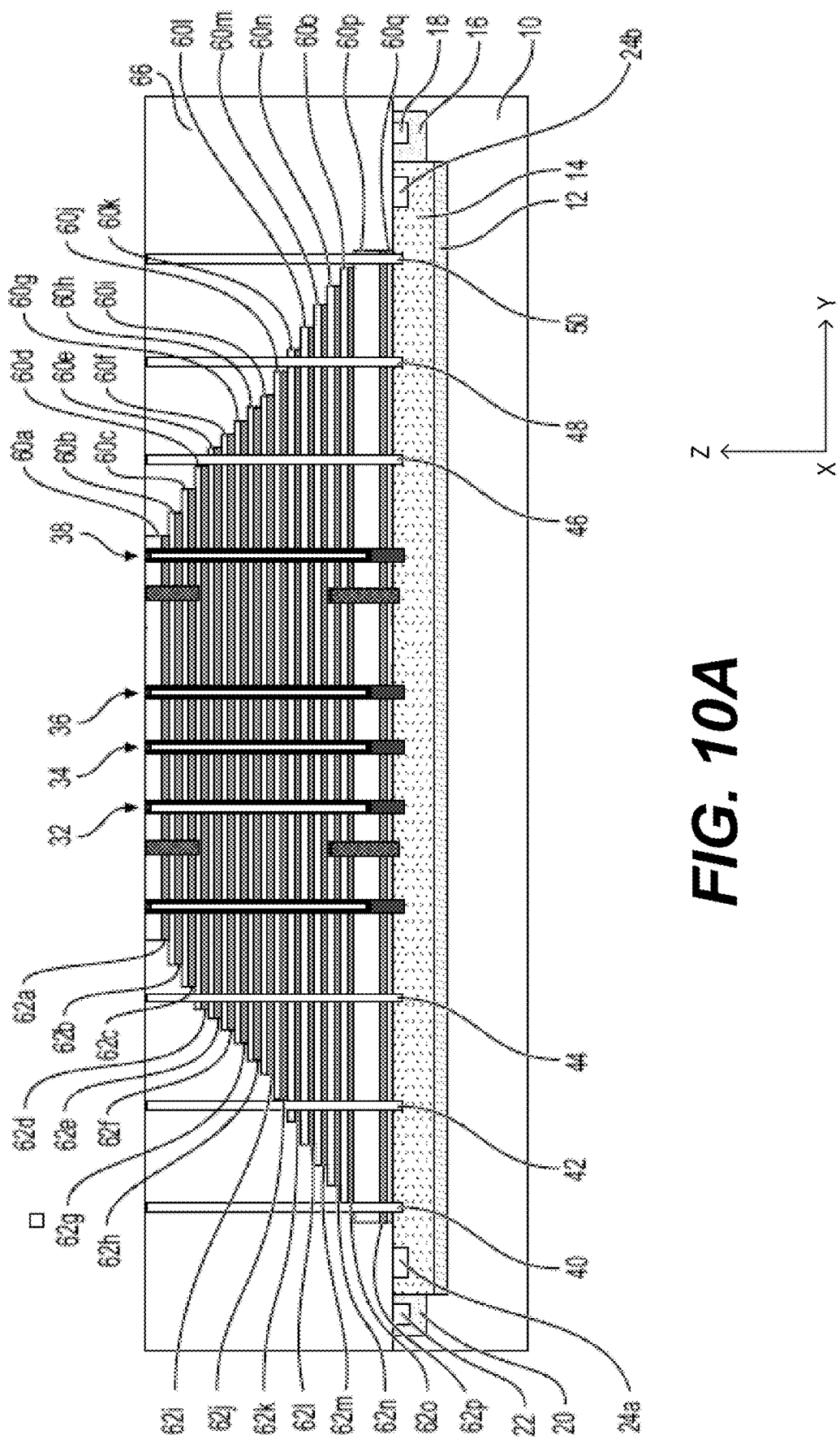

FIG. 10A is a cross-sectional view obtained in the Z-direction (height direction) of the substrate to illustrate the formation of a plurality of dummy channel structures 40, 42, 44, 46, 48, and 50. The dummy channel structures serve as sustain components to support the staircase regions 100A and 100C and/or the core regions 100B when sacrificial word lines are removed and replaced with metals. In order to form the dummy channel structures, a plurality of dummy channel openings can be formed firstly. The dummy channel openings can be formed through a photolithography process to form a patterned mask and a subsequent etching process to transfer the patterns of the mask. The dummy channel openings can be formed in the staircase regions. The formed dummy channel openings can pass through the word lines, the dummy BSGs, and the BSG, and further extend into the HVPW 14. Each of the dummy channel openings can have side portions and a bottom portion to expose the HVPW 14. When the dummy channel openings are formed, a dielectric layer can be formed to fill the dummy channel openings. The dielectric layer can include $SiO_2$, SiCN, SiOCN, or other suitable materials. A subsequent surface planarization, such as a CMP process, may be required to remove any excessive dielectric layer over the insulating layer 60a. Once the surface planarization is completed, the dielectric layer that remains in the dummy channel openings forms the dummy channel structures.

In some embodiments, the dummy channel structures can have a critical dimension (CD) between 50 nm and 200 nm. In some embodiments, the dummy channel structures can extend into the HVPW 14 with a depth between 10 nm and 200 nm. The dummy channel structures can have a circular shape. In some embodiments, the dummy channel structures can have non-circular shapes, such as a capsule shape, a rectangular shape, an arc shape, a bone shape, and the like. The non-circular shapes can be adjusted by two or more parameters, such as width, length, arc radius, arc angle, and the like. Further, in some embodiments, the non-circular shapes can be arranged in a symmetric pattern or in a non-symmetric pattern with regard to other contacts in the staircase regions.

In some embodiments, the dummy channel structures can be formed before the staircase region is formed. In some embodiments, the dummy channel structures can be formed in the core region. Accordingly, the dummy channel structures can pass through the BSG, the dummy BSGs, the plurality of word lines, the dummy TSGs, the TSG and the plurality of insulating layers to extend into the substrate. In some embodiments, the dummy channel structures can be formed with the channel structure together and have a similar structure to the channel structure. For example, the dummy structure can also include a barrier layer, a trapping layer, a tunneling layer, and a channel layer.

Figure 10B:
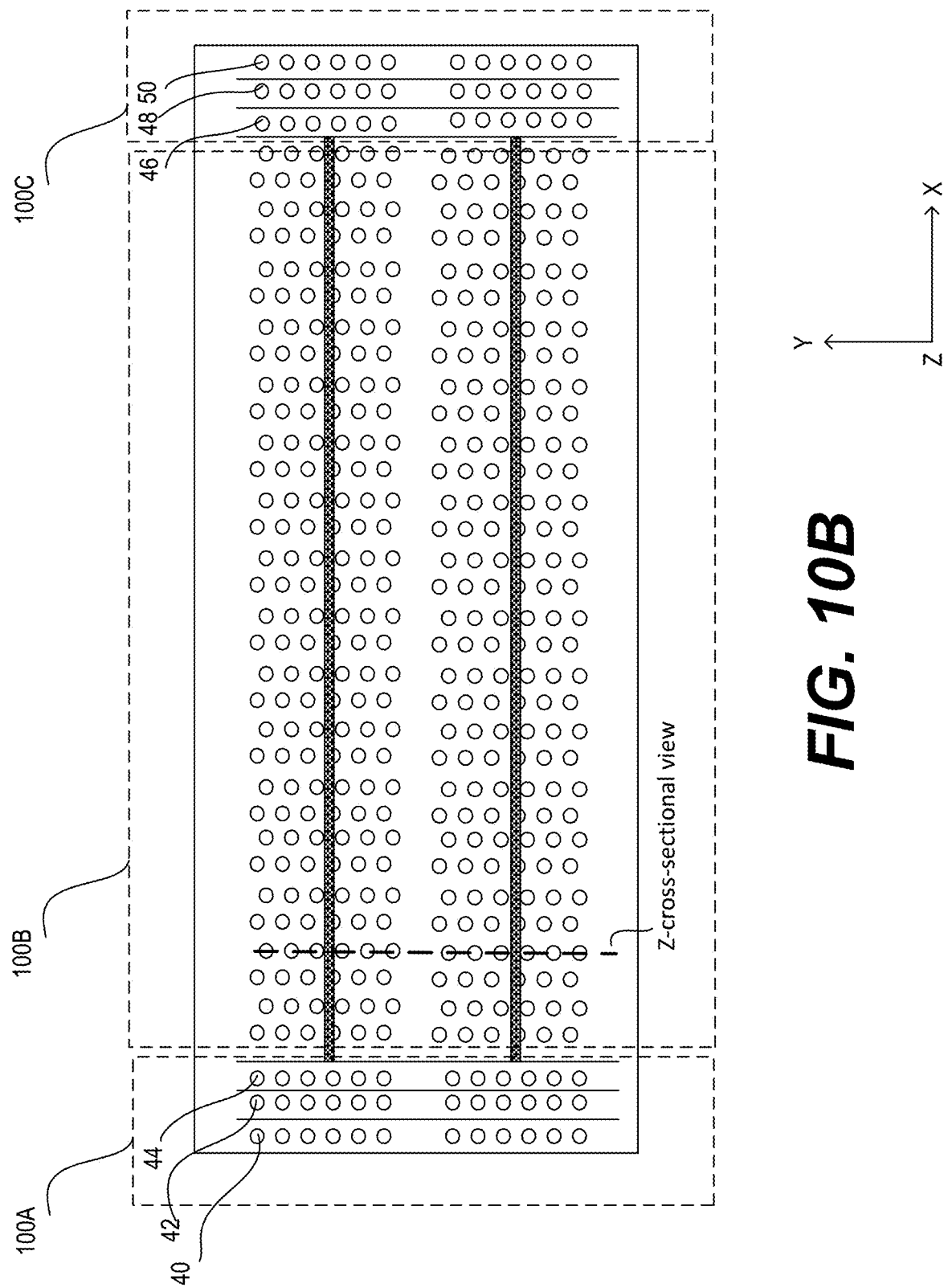

FIG. 10B is top down view to illustrate the formation of the plurality of dummy channel structures. As shown in FIG. 10B, the plurality of dummy channel structures can be formed in the two staircase regions 100A and 100C, and also core array region 100B (Especially, at the transition zones of core to staircase regions).

Figure 11A:
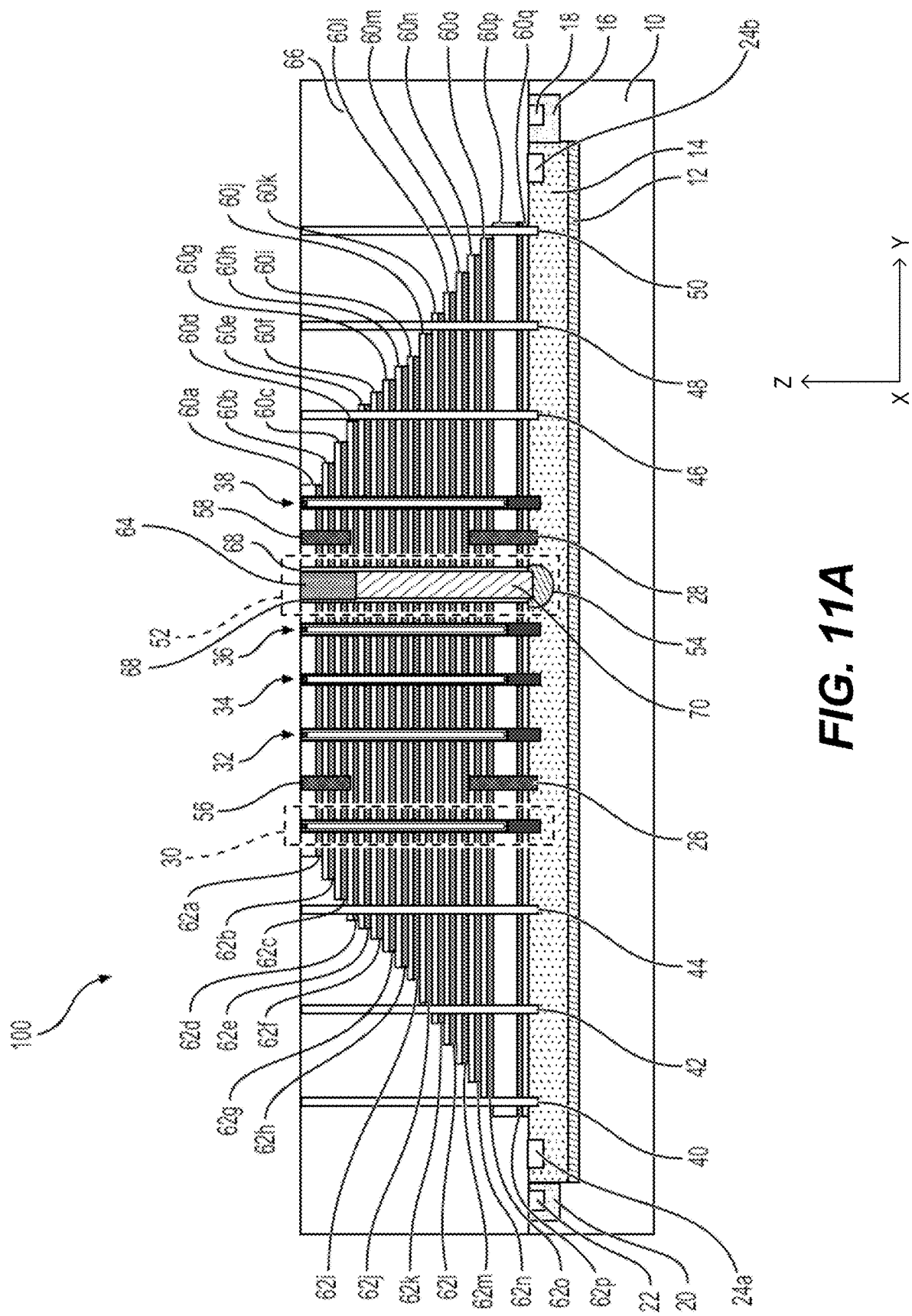

FIG. 11A is a cross-sectional view obtained in the Z-direction (height direction) of the substrate to illustrate the formation of one or more common source regions. In order to form the channel structures, one or more common source openings can be formed firstly. The common source openings can be formed through a photolithography process to form a patterned mask and a subsequent etching process to transfer the patterns of the mask. The formed common source openings pass through the TSG, the dummy TSGs, the word lines, the dummy BSGs, and the BSG, and further extend into the HVPW 14. Each of the common source openings can have side portions and a bottom portion that extend into the HVPW. The common source openings can further extend along the X-direction (Length direction) of the substrate, and are parallel disposed with the first and second trenches.

Figure 11B:
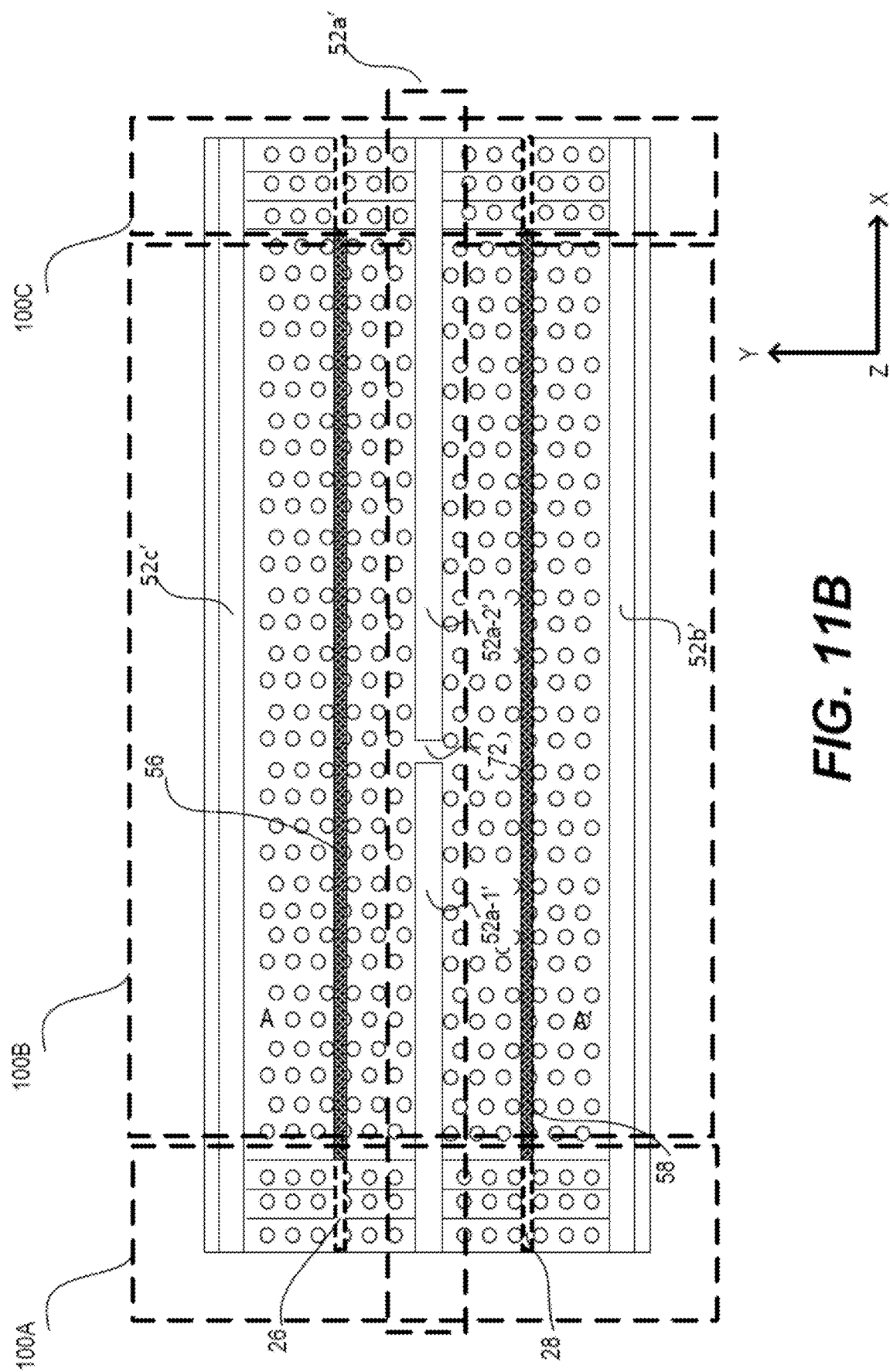

FIG. 11B shows an exemplary embodiment of the formation of the common source openings. As shown in FIG. 11B, two common source openings 52b' and 52C' are formed at two boundaries of the substrate with a continuous configuration. The common source regions 52a and 52c can be subsequently formed within the common source openings 52b' and 52c' respectively. A common source opening 52a' is formed at a middle position of the substrate. The common source opening 52a' can include two or more sub-openings based on the formed pattern of mask. For example, two sub-openings 52a-1' and 52a-2' are included in FIG. 11B. A space between the two sub-openings 52a-1' and 52a-2' forms an H-Cut, such as the H-Cut 72 in FIG. 11B. Common source regions 52a-1 and 52a-2 can be formed within the two sub-openings 52a-1' and 52a-2' respectively.

After the common source openings are formed, subsequent manufacturing steps to complete the formation of the common source regions can be different between a gate first manufacturing flow and a gate last manufacturing flow. In the gate first manufacturing flow, an ion implantation can be subsequently applied to form a dope region, such as the doped region 54, at the bottom portion of each of the common source openings. A dielectric spacer, such as the dielectric spacer 68, can be formed along the side portions of the common source openings and over the doped regions. An anisotropic plasm etching can be implemented to remove bottom portion of the dielectric spacer formed over the doped regions to expose the doped regions. A conductive layer, such as the conductive layer 70, can be deposited along the dielectric spacer and fill the common source openings. The conductive layer can be recessed afterward by an etching process, and a top contact, such as the top contact 64, can be formed along the dielectric spacer and over the conductive layer. When the top contact is formed, formation of a common source region is completed and the complete common source region 52 can be illustrated in FIG. 11A.

However, in the gate last manufacturing flow, when the common source openings are formed, the BSG, dummy BSGs, word lines, dummy TSGs, and TSG are subsequently removed to form a plurality of vacancies by a wet etching chemical that is introduced through the common source openings. An ion implantation can be thereafter applied to form the dope region (e.g., 54) at the bottom portion of each of the common source openings. Following the implantation step, the BSG, dummy BSGs, word lines, dummy TSGs, and TSG are re-formed by filling the vacancies with a high-K layer plus metal layers through the common source openings. Next, a dielectric spacer, such as the dielectric spacer 68, can be formed along the side portions of the common source openings and over the doped regions. A followed anisotropic plasm etching can be implemented to remove bottom portion of the dielectric spacer formed over the doped regions to expose the doped regions. A conductive layer, such as the conductive layer 70, can be deposited along the dielectric spacer and fill the common source openings. The conductive layer can be recessed afterward by an etching process, and a top contact, such as the top contact 64, can be formed along the dielectric spacer and over the conductive layer. When the top contact is formed, formation of the common source regions is completed and the complete common source regions can be illustrated in FIG. 11A.

After the formation of the common source regions, a final memory device 100 is formed which is identical to the memory device 100 illustrated in FIG. 1A.

Figure 11C:
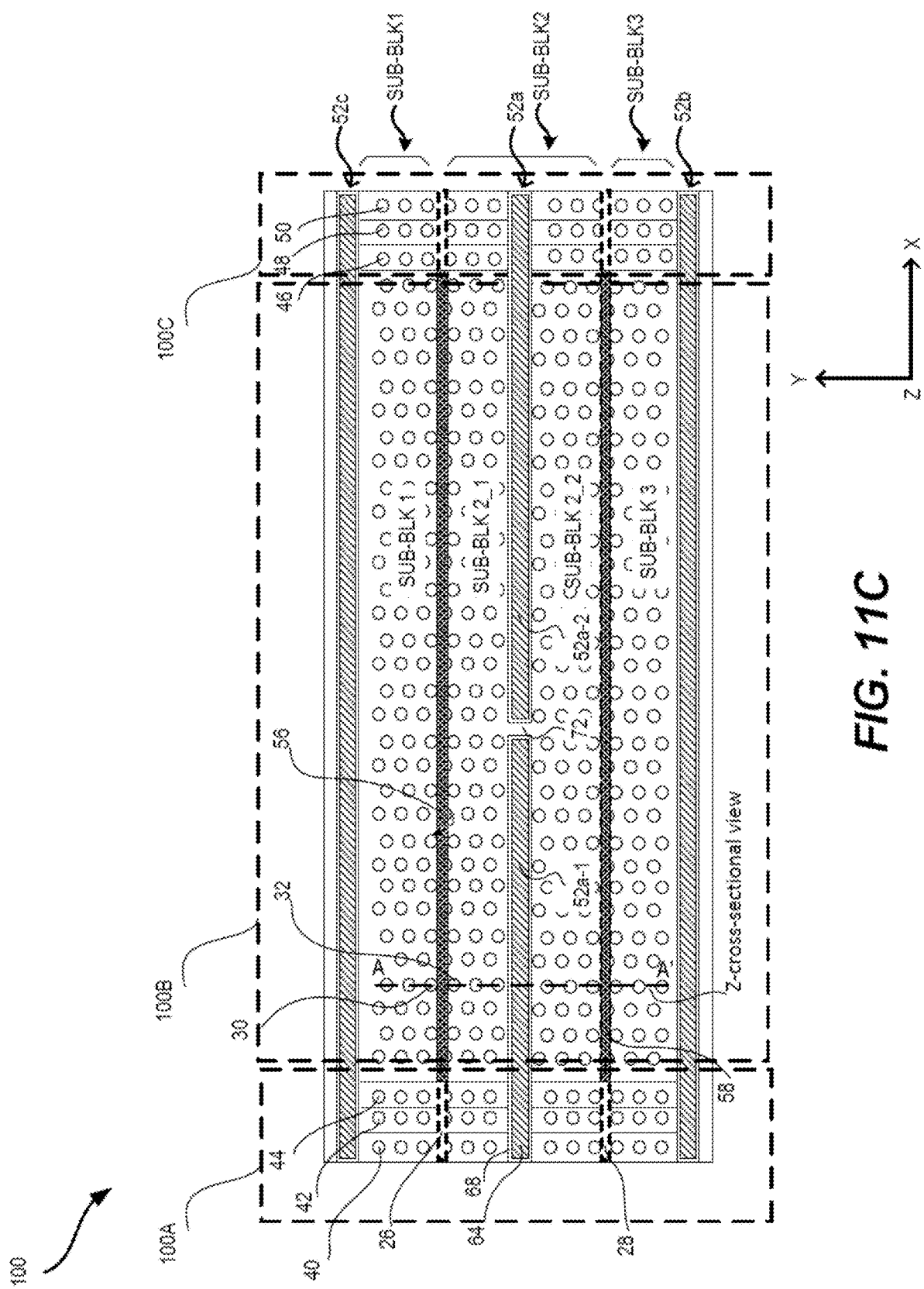

FIG. 11C is top down view to illustrate the formation of one or more common source regions. As shown in FIG. 11C, the memory device 100 can have three common source regions 52a-52c. The common source regions 52a-52c are formed along the X-direction (length direction) of the substrate 10 and are disposed at two boundaries and a middle position of the memory device 100. The common source regions 52b and 52C are disposed at two boundaries of the memory device 100 with a continuous configuration. The common source region 52a is disposed at a middle position of the memory device 100. The common source region (CSR) 52a is separated by the H-cut 72 into two sub-CSRs 52a-1 and 52a-2. The first trenches 26 and 28, and the second trenches 56 and 58 are aligned with each other at the Y direction (width direction) of the substrate 10. The first trenches and the second trenches are disposed between two adjacent common source regions.

Figure 11D:
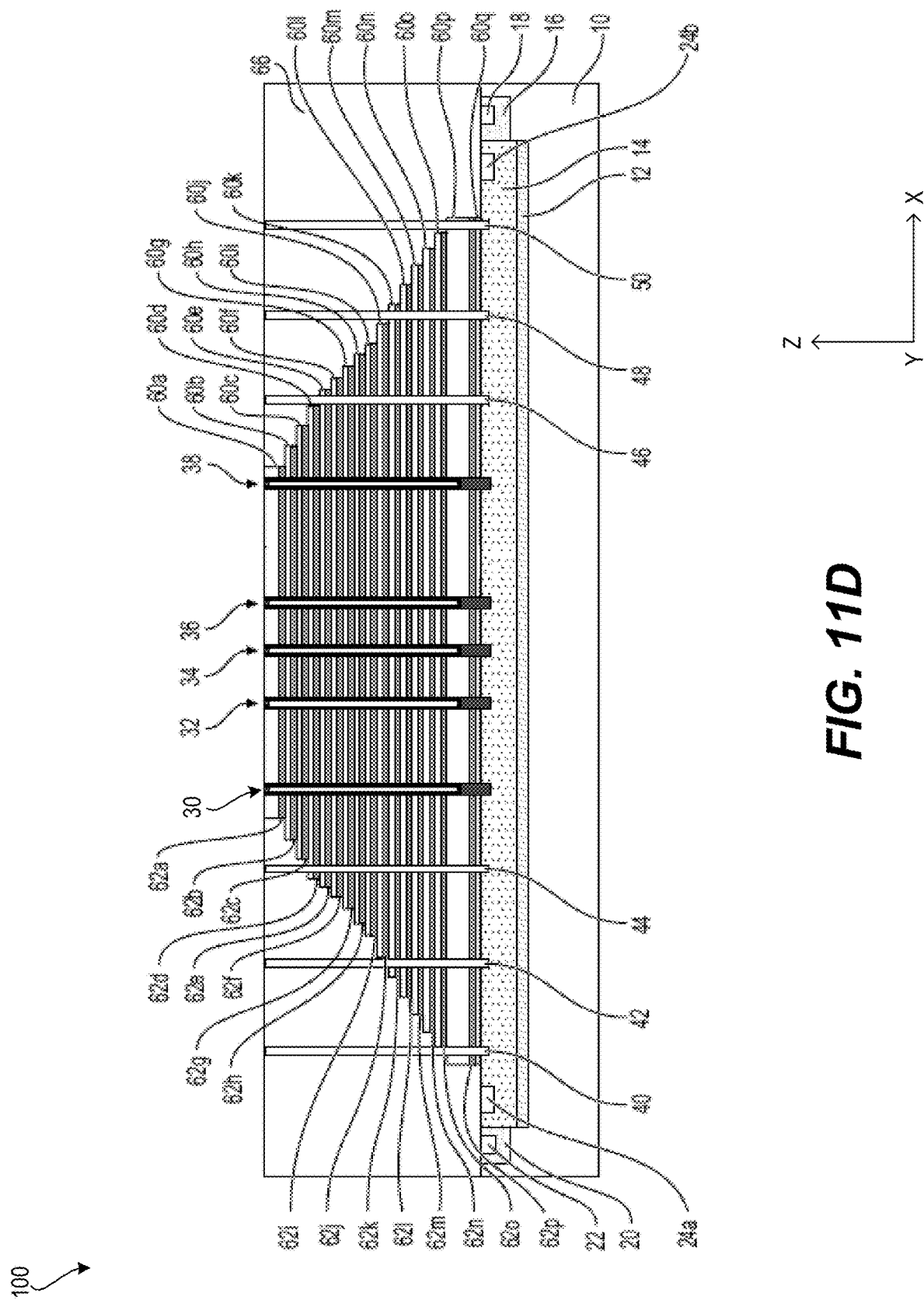

FIG. 11D is a cross-sectional view obtained in the X-direction (length direction) of the substrate to illustrate the final structure of the memory device 100. As shown in FIG. 11D, the first trenches, the second trenches and the common source regions cannot be observed from the cross-sectional view that is obtained in the X-direction (length direction) of the substrate.

Figure 12:
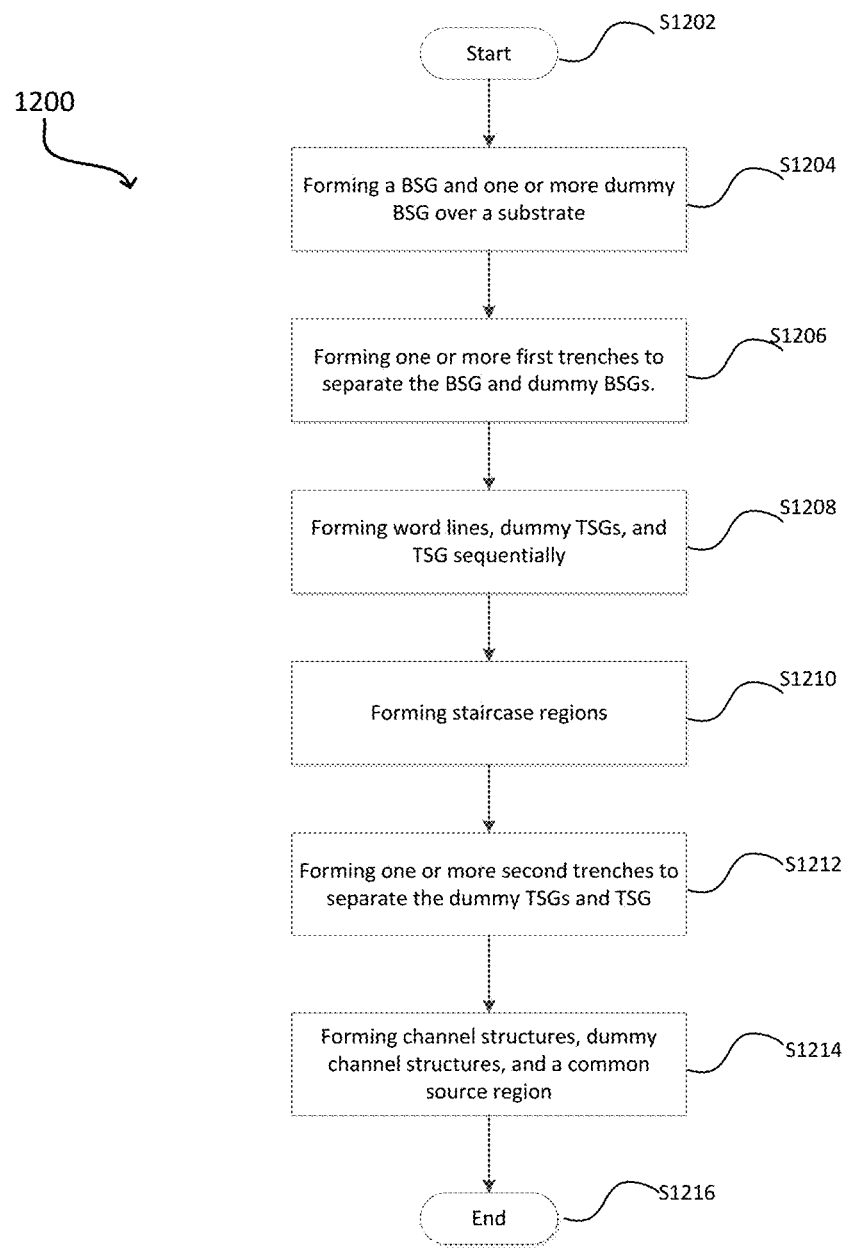
FIG. 12 is a flowchart of a process for manufacturing a 3D-NAND memory device, in accordance with exemplary embodiments of the disclosure.

FIG. 12 is a flowchart of a process 1200 for manufacturing a 3D NAND memory device 100 in accordance with some embodiments. The process 1200 begins at step 1204 where one or more BSGs and one or more dummy BSGs are formed sequentially over a substrate. In addition, a plurality of first insulating layers are formed between the substrate, the BSGs and the dummy BSGs. The substrate can include a plurality of doped regions to reduce the resistance between the substrate and subsequently formed contact structures. The substrate, BSGs and dummy BSGs are spaced apart from each other by the first insulating layers.

In step 1206 of the process 1200, one or more first trenches are formed in the BSGs and dummy BSGs. The first trenches pass through the BSGs, dummy BSGs, and the first insulating layers, and extend into the substrate. The first trenches further extend along a X-direction (length direction) of the substrate. The first trenches separate the BSGs, the dummy BSGs into a plurality of sub-BSGs, and sub-dummy BSGs. In some embodiments, steps 1204 and 1206 can be performed as illustrated with reference to FIGS. 5A-5C.

The process 1200 then proceeds to step 1208 where a plurality of word lines, one or more dummy TSGs, and one or more TSGs are stacked over the dummy BSGs sequentially. In addition, a plurality of second insulating layers are formed over the dummy BSGs and disposed between the dummy BSGs, the word lines, the dummy TSGs, and TSGs. In some embodiments, step 1208 can be performed as illustrated with reference to FIG. 6.

In step 1210, one or more staircase regions can be formed. The staircase regions are configured to provide spaces to form dummy channel structure as well as word line contacts (not shown). The formation of the staircase regions can be implemented by alternatively repeating a mask patterning process and a plasma etching process. The formed staircase regions are positioned at two sides of the substrate and a core region is position in the middle. In some embodiments, step 1208 can be performed as illustrated with reference to FIGS. 7A-7F.

The process 1200 proceeds to step 1212 where one or more second trenches are formed in the dummy TSGs and the TSGs. The second trenches extend along the length direction of the substrate. The second trenches further pass through the dummy TSG, the TSGs and a portion of the second insulating layers therebetween. The first trenches and the second trenches are aligned with each other in a width direction of the substrate and are spaced apart by the plurality of word line layers. The TSGs are separated by the second trenches into a group of sub-TSGs, and the TSGs are separated by the second trenches into a group of sub-dummy TSGs. In some embodiments, step 1212 can be performed as illustrated with reference to FIGS. 8A-8C.

In step 1214 of the process 1200, a plurality of channel structures can be formed in the core region. The formation of the channel structures can be performed as illustrated with reference to FIGS. 9A-9B. Next, a plurality of dummy channel structures can be formed in the staircase regions. The formation of the dummy channel structures can be performed as illustrated with reference to FIGS. 10A-10B.

It should be understood that the channel structures can also be formed before the staircase region is formed. In some embodiments, the dummy channel structures can be formed in the core region. In some embodiments, the dummy channel structures can be formed with the channel structure together and have a similar structure to the channel structure. For example, the dummy structure can also include a barrier layer, a trapping layer, a tunneling layer, and a channel layer.

Still in step 1214, one or more common source regions can be formed after the formation of the dummy channel structures. The common source regions extend through the BSGs, the dummy BSGs, the word lines, the dummy TSGs, the TSGs, and the first and second insulating layers. Each of the common source regions is electrically coupled with the substrate via a respective doped region. The common source regions, the first trenches and the second trenches further extend parallel to each other along the length direction of the substrate. In some embodiments, the formation of the common source regions further includes removing the BSGs, the dummy BSGs, the word lines, the dummy TSGs, and the TSGs, and re-forming the BSGs, the dummy BSGs, the word lines, the dummy TSGs, and the TSGs with a high-K layer and metal layers. In some embodiments, the formation of the common source regions can be performed as illustrated with reference to FIGS. 11A-11D.

It should be noted that additional steps can be provided before, during, and after the process 1200, and some of the steps described can be replaced, eliminated, or performed in different order for additional embodiments of the process

1200. In subsequent process steps, various additional interconnect structures (e.g., metallization layers having conductive lines and/or vias) may be formed over the semiconductor device 1200. Such interconnect structures electrically connect the semiconductor device 1200 with other contact structures and/or active devices to form functional circuits. Additional device features such as passivation layers, input/output structures, and the like may also be formed.

The various embodiments described herein offer several advantages over related memory devices. For example, in the related memory devices, a plurality of memory cell blocks or memory cell arrays can be included. Each of the blocks can include a plurality of vertical NAND memory cell strings. In the related memory device, the vertical NAND memory cell strings in a same block can have a common/shared bottom select gate (BSG). The shared BSG accordingly controls all the bottom select transistors (BSTs) of the vertical NAND memory cell strings in that block simultaneously during operating the related 3D-NAND memory device, such as erasing the related 3D-NAND memory device. As the related 3D-NAND memory device migrates to higher capacity with an increasing block size, the shared BSG can induce longer erasing time, longer data transfer time, and lower storage efficiency.

In the disclosed memory device, each of the blocks is separated into a plurality of sub-blocks by dividing the shared BSG into a plurality of sub-BSGs through one or more first trenches. Each of the sub-blocks has a respective sub-BSG, and each of the sub-blocks can be operated individually through controlling the respective sub-BSG. By introducing such a divided BSG structure, the disclosed 3D-NAND memory device can effectively reduce parasitic capacitance and coupling effects between the BSG and adjacent dielectric layers, and significantly improve $V_t$ performance of the bottom select transistors (BSTs). In addition, the erasing time and data transfer time could be reduced significantly, and data storage efficiency can be improved as well.

In the disclosed memory device, the each of sub-blocks can further have a respective sub-top select gate (sub-TSG) by dividing a shared TSG into a plurality of sub-TSGs through one or more second trenches. Each of the sub-TSGs can control a respective sub-block during a reading/programming operation. In some embodiments, the first and second trenches can be formed via a same reticle set so that a manufacturing cost can be reduced.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
  a bottom select gate (BSG);
  a word line positioned over the BSG with a staircase configuration;
  a top select gate (TSG) positioned over the word line;
  an insulating layer disposed between the BSG, the word line, and the TSG;
  a first dielectric trench formed in the BSG and separate the BSG into a plurality of sub-BSGs; and
  a second dielectric trench formed in the TSG and separating the TSG into a plurality of sub-TSGs; wherein:
  the first dielectric trench and the second dielectric trench are aligned with each other in a height direction of the insulating layer and are spaced apart by the word line.

2. The memory device of claim 1, further comprising a common source region, wherein the common source region extends through the BSG, the word line and the insulating layer.

3. The memory device of claim 2, wherein the common source region further extends through the TSG.

4. The memory device of claim 1, further comprising a channel structure, wherein the channel structure extends through the BSG, the word line, the insulating layer and the TSG.

5. The memory device of claim 1, further comprising a dummy channel structure, wherein the dummy channel structure extends through the BSG, the word line and the insulating layer.

6. The memory device of claim 2, wherein:
  the first dielectric trench and the common source region are alternatively disposed in a width direction of the insulating layer, and
  the second dielectric trench and the common source region are alternatively disposed in the width direction of the insulating layer.

7. A memory device, comprising:
  a substrate;
  a bottom select gate (BSG) positioned over the substrate;
  a word line positioned over the BSG with a staircase configuration;
  an insulating layer disposed between the substrate, the BSG and the word line;
  a first dielectric trench formed in the BSG and separating the BSG into a plurality of sub-BSGs;
  a common source region formed over the substrate, wherein the first dielectric trench and the common source region are alternatively disposed in a width direction of the substrate,
  a top select gate (TSG) positioned over the word line, the TSG and the word line being spaced apart by the insulating layer; and
  a second dielectric trench formed in the TSG and separate the TSG into a plurality of sub-TSGs.

8. The memory device of claim 7, wherein the first dielectric trench and the second dielectric trench are aligned with each other in a height direction of the substrate.

9. The memory device of claim 7, wherein the common source region extends through the BSG, the word line, the insulating layer and the TSG.

10. The memory device of claim 7, further comprising a channel structure, wherein the channel structure extends through the BSG, the word line, the insulating layer and the TSG.

11. The memory device of claim 7, further comprising a dummy channel structure, wherein the dummy channel structure extends through the BSG, the word line and the insulating layer.

12. The memory device of claim 7, wherein the second dielectric trench and the common source region are alternatively disposed in the width direction of the substrate.

13. A memory device, comprising:
  a bottom select gate (BSG);
  a top select gate (TSG) positioned over the BSG;

a first dielectric trench formed in the BSG and extending in a first direction to separate the BSG into a plurality of sub-BSGs;

a second dielectric trench formed in the TSG and extending in the first direction to separate the TSG into a plurality of sub-TSGs; and a common source region extending in the first direction, wherein:

the memory device is divided into a first sub-block, a second sub-block and a third sub-block by the common source region, the first dielectric trench and the second dielectric trench, and a size of the second sub-block in a second direction perpendicular to the first direction is larger than the first sub-block and the third sub-block.

14. The memory device of claim 13, further comprising:

a word line positioned between the BSG and the TSG; and an insulating layer disposed between the BSG, the word line, and the TSG, wherein:

the common source region extends through the BSG, the word line, the insulating layer and the TSG.

15. The memory device of claim 13, wherein:

the first dielectric trench and the common source region are alternatively disposed in the second direction, and the second dielectric trench and the common source region are alternatively disposed in the second direction.

16. The memory device of claim 14, wherein the first dielectric trench and the second dielectric trench are aligned with each other in a height direction of the insulating layer.

17. The memory device of claim 13, wherein the second sub-block is positioned between the first sub-block and the third sub-block in the second direction.

18. The memory device of claim 17, wherein the common source region comprises a first common source region, a third common source region and a second common source region positioned between the first common source region and the third common source region in the second direction, wherein the second common source region comprises a H-Cut.

19. The memory device of claim 18, wherein the second sub-block comprises a first portion and a second portion, wherein the first portion and the second portion are connected with each other through the H-Cut.

* * * * *